(12) United States Patent
VanCamp et al.

(10) Patent No.: US 11,513,158 B1
(45) Date of Patent: Nov. 29, 2022

(54) DETECTING CONDUCTING FLUIDS IN EXTERNAL CONNECTORS OF CONFORMABLE WEARABLE BATTERY PACKS

(71) Applicant: Inventus Power, Inc., Woodridge, IL (US)

(72) Inventors: Richard E. VanCamp, Aurora, IL (US); John Seo, Hoffman Estates, IL (US); King Moy, Orland Park, IL (US); Christopher M. Reinke, Naperville, IL (US)

(73) Assignee: Inventus Power, Inc., Woodridge, IL (US)

( * ) Notice: Subject to any disclaimer, the term of this patent is extended or adjusted under 35 U.S.C. 154(b) by 0 days.

(21) Appl. No.: 17/664,815

(22) Filed: May 24, 2022

(51) Int. Cl.
| | | |
|---|---|---|
| *G01R 31/00* | (2006.01) | |
| *G01R 31/3835* | (2019.01) | |
| *H01M 10/42* | (2006.01) | |
| *H01M 50/569* | (2021.01) | |

(52) U.S. Cl.
CPC ...... *G01R 31/3835* (2019.01); *H01M 10/425* (2013.01); *H01M 50/569* (2021.01); *H01M 2010/4271* (2013.01)

(58) Field of Classification Search
USPC .................................................. 324/426, 433
See application file for complete search history.

(56) References Cited

U.S. PATENT DOCUMENTS

| | | |
|---|---|---|
| 8,200,852 B2 | 6/2012 | Liu et al. |
| 8,725,910 B1 | 5/2014 | Sala et al. |
| 9,030,155 B1 | 5/2015 | Li et al. |
| 9,099,864 B2 | 8/2015 | Shoykhet et al. |
| 9,483,093 B2 | 11/2016 | Okamoto et al. |
| 9,589,491 B2 | 3/2017 | Won |

(Continued)

FOREIGN PATENT DOCUMENTS

| | | |
|---|---|---|
| CN | 111917163 A | 11/2020 |
| JP | 2018032221 A | 3/2018 |

(Continued)

OTHER PUBLICATIONS

Jul. 28, 2022—(US) Ex Parte Quayle—U.S. Appl. No. 17/664,798.

*Primary Examiner* — Vincent Q Nguyen
(74) *Attorney, Agent, or Firm* — Banner & Witcoff, Ltd.

(57) ABSTRACT

One or more external connectors of a conformal wearable battery (CWB) may be controlled to reduce a voltage potential supplied to the connectors when exposed to a conductive liquid. The connectors may be uniform serial bus (USB) connectors or other connectors. One or more unused terminals of the one or more connectors may be pulled to a voltage potential and then monitored for a change in voltage. When the change in voltage satisfies a voltage threshold, the voltage potential supplied to the one or more connectors may be reduced and/or interrupted. The change in voltage may be evaluated against the voltage threshold alone or may be evaluated against the voltage threshold and a time threshold relating to a time after the voltage satisfied the voltage threshold. The voltage of the monitored terminal may be evaluated against one or more voltage thresholds and/or one or more time thresholds. Based on the voltage threshold having been met, the voltage supplied to the connector may be reduced or stopped.

20 Claims, 12 Drawing Sheets

(56) References Cited

U.S. PATENT DOCUMENTS

| | | | |
|---|---|---|---|
| 9,740,258 B2 | 8/2017 | Morning-Smith et al. | |
| 10,042,801 B2 | 8/2018 | Chang | |
| 10,229,086 B2 | 3/2019 | Barcohen et al. | |
| 10,635,151 B2 | 4/2020 | Kim | |
| 10,837,934 B2 | 11/2020 | Park et al. | |
| 10,859,640 B2 | 12/2020 | Ko et al. | |
| 10,862,246 B2 | 12/2020 | Bae et al. | |
| 10,928,343 B2 | 2/2021 | Park et al. | |
| 11,181,561 B2 | 11/2021 | Lee | |
| 11,329,438 B2 | 5/2022 | Kim | |
| 2020/0059047 A1 | 2/2020 | Kim | |
| 2020/0117633 A1 | 4/2020 | Nisarga et al. | |
| 2021/0305822 A1* | 9/2021 | Yu | G01R 31/3274 |
| 2022/0059978 A1 | 2/2022 | Kim | |

FOREIGN PATENT DOCUMENTS

| | | |
|---|---|---|
| KR | 20180003771 A | 1/2018 |
| KR | 20190070830 A | 6/2019 |
| KR | 20190113501 A | 10/2019 |
| KR | 102356703 B1 | 1/2022 |

\* cited by examiner

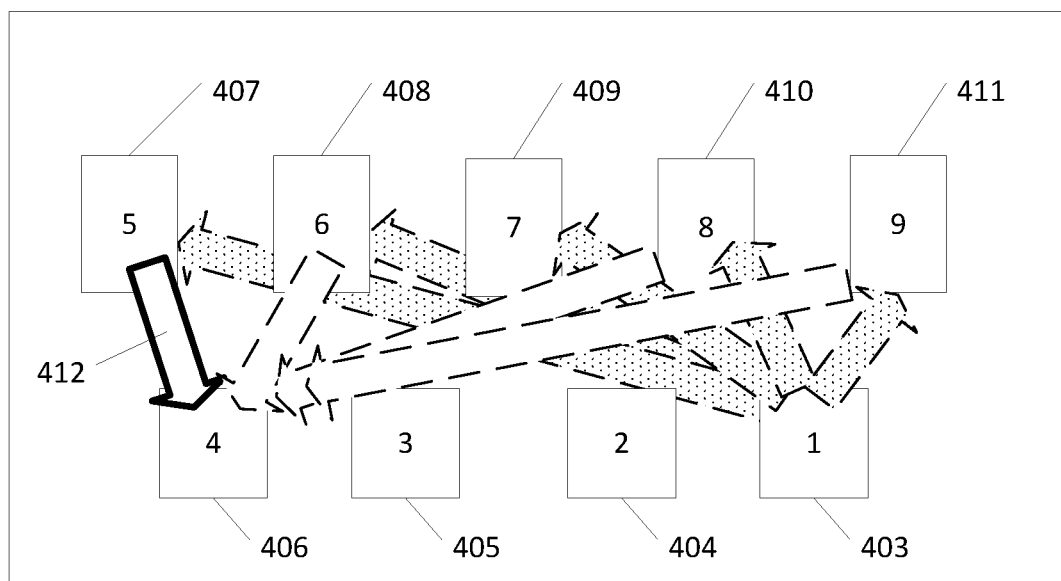
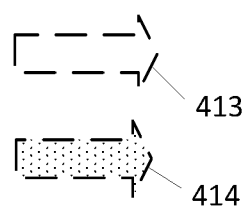
Fig. 4

| Condition | Initial Voltage | Settle Voltage | ADC Reading |
|---|---|---|---|
| Floating | 3.15V | 3.15V | 0x1BA (3.15V) |
| Distilled | ~1.70V | ~1.90V | 0x170 (1.90V) |
| Tap | ~0.90V | ~1.30V | 0x14A (1.30V) |
| 1/2 Salt | ~0.52V | ~0.54V | 0x0A3 (0.54V) |
| Full Salt | ~0.46V | ~0.48V | 0x093 (0.48V) |

Fig. 6

| Threshold Voltage | Condition | Time Threshold Set A | Time Threshold Set B | Time Threshold Set C |
|---|---|---|---|---|
| 3.15V | Floating | - | - | - |
| 1.90V | Distilled - Settled | X seconds | Z seconds | G seconds |
| 1.70V | Distilled - Initial | X seconds | Y seconds | H seconds |
| 1.30V | Tap - Settled | X seconds | Z seconds | I seconds |
| 0.90V | Tap - Initial | X seconds | Y seconds | J seconds |
| 0.54V | 1/2 Salt - Settled | X seconds | Z seconds | K seconds |
| 0.52V | 1/2 Salt - Initial | X seconds | Y seconds | L seconds |
| 0.48V | Full Salt - Settled | X seconds | Z seconds | M seconds |
| 0.52V | Full Salt - Initial | X seconds | Y seconds | N seconds |

Fig. 7

DETECTING CONDUCTING FLUIDS IN EXTERNAL CONNECTORS OF CONFORMABLE WEARABLE BATTERY PACKS

RELATED APPLICATIONS

The following applications are related and each is expressly incorporated herein by reference for all purposes:
1. U.S. patent application Ser. No. 17/664,798, filed May 24, 2022, entitled "Detecting Conducting Fluids in External Connectors of Conformable Wearable Battery Packs using Unused Pins", filed herewith;
2. U.S. patent application Ser. No. 17/664,811, filed May 24, 2022, entitled "Disconnecting Power from External USB Connectors of Conformable Wearable Battery Packs in the Presence of Conducting Fluids", filed herewith; and
3. U.S. patent application Ser. No. 17/664,815, filed May 24, 2022, entitled "Detecting Conducting Fluids in External Connectors of Conformable Wearable Battery Packs", filed herewith.

TECHNICAL FIELD

Aspects described herein generally relate to electrical power storage systems. More specifically, aspects of this disclosure relate to determining the presence of a conducting liquid between the contacts of an electrical connector.

BACKGROUND

Batteries may come in different shapes and sizes depending on their intended usage. Some batteries may be arranged as packages of battery cells that are assembled together to provide a predetermined power output. These battery packages may be arranged in a durable and sealed housing to protect the batteries from damage. In some instances, the battery packages may be designed to flex or bend to accommodate their intended usage. In addition, portable battery systems may be utilized to provide mobile electrical power and/or when located apart from a line voltage source. Integrated communications equipment and/or weapons systems utilized, for example, by law enforcement and/or military personnel require increasingly high levels of power storage carried proximate a user's body. Methods of increasing power storage capability in a device, such as a conformal wearable battery (CWB), is to include additional battery cells and/or use larger battery cells. While in the field, CWBs may encounter hostile environments that may short external connectors of the CWBs. The shorting may cause damage to the connectors and/or damage to the CWBs themselves. The damage may be known immediately or, in the case of oxidation of terminals, may only become known after time. Based on the extent of oxidation, the damage may be irreversible and require replacement of the external connectors of the CWBs.

As such, a need exists within the mobile electrical power storage industry for reducing the effects of exposure of terminals to hostile environments while maintaining the functionality of the power storage systems.

SUMMARY

The following presents a simplified summary of various aspects described herein. This summary is not an extensive overview, and is not intended to identify key or critical elements or to delineate the scope of the claims. The following summary merely presents some concepts in a simplified form as an introductory prelude to the more detailed description provided below.

Aspects of the disclosure provide solutions that address conduction between terminals of a connector and/or between terminals of different conductors. In some aspects, the connector or connectors may be uniform serial bus (USB) connectors, Thunderbolt connectors, Lightning connectors, FireWire connectors, Power over Ethernet connectors, and the like. In one or more aspects, one or more unused terminals may be pulled to one voltage potential and the terminals' voltages may be monitored to detect changes. Based on detected changes, the power supplied to the connector or connectors (and subsequent current flow) may be reduced or stopped. In some aspects, the power may be modified until an external reset is applied to the power system. In other aspects, the power system may include one or more internal timers to reapply power and check again for conduction between the terminals. In some examples, power may be partially restored to the connector. In other examples, power may be fully restored to the connector.

In some aspects, conduction between individual terminals in a single connector may be monitored. In other aspects, conduction between terminals of different connectors may be monitored. For instance, one connector may have no unused terminals and is required to maintain a voltage difference between terminals. In this example, a second connector may be selectively unpowered and one or more of its terminals used to detect a change in voltage over time.

Benefits of detecting conduction between terminals may include reducing long-term electrolytic corrosion between terminals. Terminals of connectors are often plated in a non-reactive metal or alloy or other material. Depending on the type of terminal, the mechanical act of connecting and disconnecting male and female connectors may wear down the non-reactive surface of the terminals. Over time, a reactive material under the non-reactive metal/alloy/other material may be exposed. In the presence of a conducting liquid (e.g., salt water or other liquid with sufficient ions) and a voltage potential between terminals, electrolytic corrosion of the reactive material may be accelerated, thereby increasing the impedance of connection between the terminal of the connector and a terminal of a plug. Further, where the materials are dissimilar, galvanic corrosion may occur in the presence of a conducting liquid (e.g., an electrolyte). That increase in impedance may affect the charging of the battery and/or reduce the availability of power for an external device. One or more aspects detect the presence of a conductive liquid in a connector. Other aspects modify the power provided to one or more connectors to reduce potential corrosion of the conductors caused by current flowing between those connectors.

These features, along with many others, are discussed in greater detail below.

BRIEF DESCRIPTION OF THE DRAWINGS

The present disclosure is illustrated by way of example and not limited in the accompanying figures in which like reference numerals indicate similar elements and in which:

FIG. 4 shows a plan view of the USB Type-A version 3.0+ connector of FIG. 3 showing the first potential conduction path and possible additional conduction paths;

FIG. 6 is a table of sample voltage level readings relating to voltage readings between conductors of a connector immersed in different conducting liquids;

FIG. 7 is a sample table of voltage thresholds and time thresholds;

DETAILED DESCRIPTION

Figure 1:
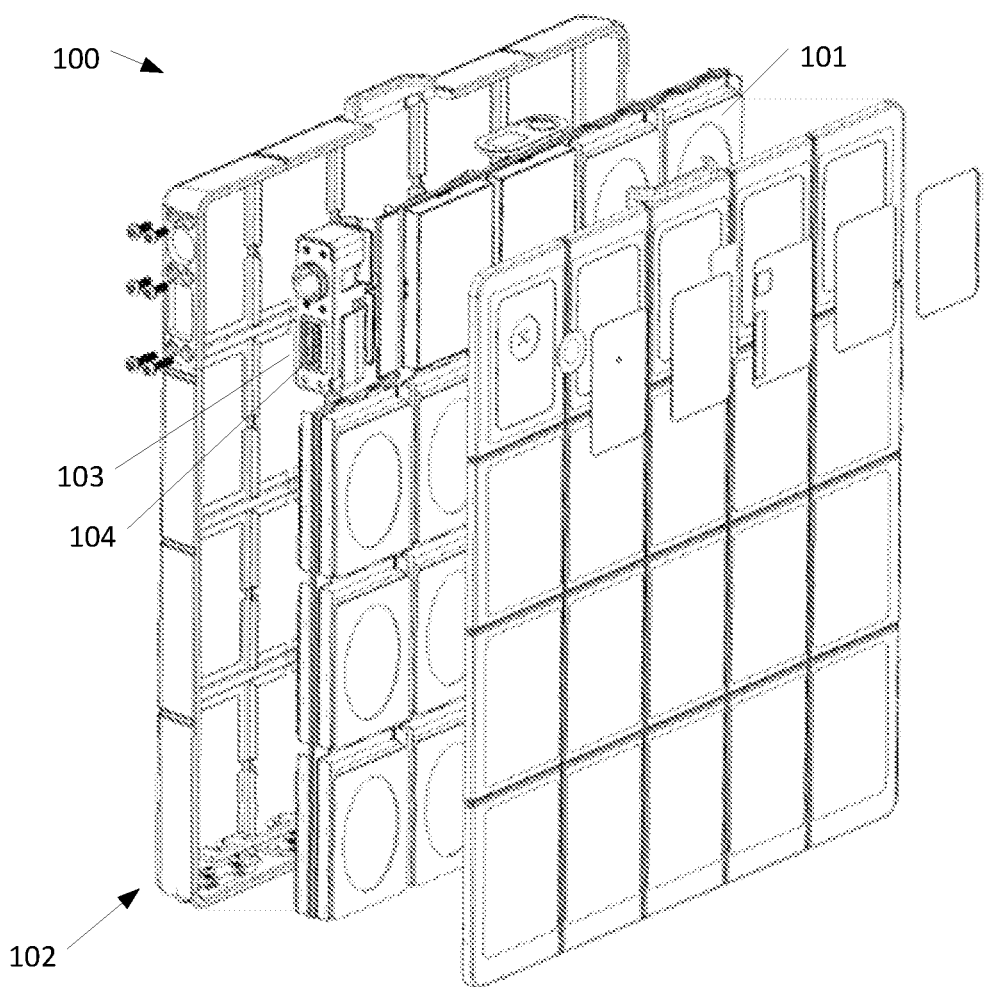
FIG. 1 shows an exploded perspective view of a conformable wearable battery (CWB)

In the following description of various illustrative arrangements, reference is made to the accompanying drawings, which form a part hereof, and in which is shown, by way of illustration, various arrangements in which aspects of the disclosure may be practiced. It is to be understood that other arrangements may be utilized, and structural and functional modifications may be made, without departing from the scope of the present disclosure. The drawings may not be shown to scale.

In general, aspects of the disclosure are capable of other embodiments and of being practiced or being carried out in various ways. Also, it is to be understood that the phraseology and terminology used herein are for the purpose of description and should not be regarded as limiting. Rather, the phrases and terms used herein are to be given their broadest interpretation and meaning. Any sequence of computer-implementable instructions described in this disclosure may be considered to be an "algorithm" as those instructions are intended to solve one or more classes of problems or to perform one or more computations. While various directional arrows are shown in the figures of this disclosure, it the directional arrows are not intended to be limiting to the extent that bi-directional communications are excluded. Rather, the directional arrows are to show a general flow of steps and not the unidirectional movement of information, signals, and/or power. In the entire specification, when an element is referred to as "comprising" or "including" another element, the element should not be understood as excluding other elements so long as there is no special conflicting description, and the element may include at least one other element. In addition, the terms "unit" and "module", for example, may refer to a component that exerts at least one function or operation, and may be realized in hardware or software, or may be realized by combination of hardware and software. Throughout the specification, the expression "at least one of a, b, and c" may include 'a only', 'b only', 'c only', 'a and b', 'a and c', 'b and c', and/or 'all of a, b, and c'. The expression "at least one of a, b, or c" may include 'a only', 'b only', 'c only', 'a and b', 'a and c', 'b and c', and/or 'all of a, b, and c'. Similarly, the expression "one or more of a, b, and c" may include 'a only', 'b only', 'c only', 'a and b', 'a and c', 'b and c', and/or 'all of a, b, and c'. The expression "one or more of a, b, or c" may include 'a only', 'b only', 'c only', 'a and b', 'a and c', 'b and c', and/or 'all of a, b, and c'.

It is noted that various connections between elements are discussed in the following description. It is noted that these connections are general and, unless specified otherwise, may be direct or indirect, and that the specification is not intended to be limiting in this respect. As described herein, thresholds are referred to as being "satisfied" to generally encompass situations involving thresholds above increasing values as well as encompass situations involving thresholds below decreasing values. The term "satisfied" is used with thresholds to address when values have passed a threshold and then approaching the threshold from an opposite side as using terms such as "greater than", "greater than or equal to", "less than", and "less than or equal to" can add ambiguity where a value repeated crosses a threshold.

One or more aspects of the disclosure relate to detecting the presence of a conducting liquid in one or more external connectors of portable power supply. Other aspects relate to modifying how power is supplied to one or more external connectors based on a determination that conduction is occurring between one or more terminals of a single external connector or between a terminal of a first external connector and a terminal of a second external connector. The determination may be performed in hardware, software, or a combination of hardware and software.

As described herein for the purpose of explanation, one connector may always be in an active state such that a high voltage potential (e.g., VDD/VCC) is always being supplied to a power terminal of the connector and ground potential (e.g., zero volts, VS S, or low voltage of the battery pack) is always being supplied to a ground terminal of the connector. Also, as described herein, one or more unused terminals may be pulled to one potential (e.g., high via a pull-up resistor) or another (e.g., low via a pull-down resistor) and the voltage or voltages of the one or more unused terminals monitored for changes satisfying one or more voltage thresholds. Connectors that are always on may be used to provide power to external devices. While disabling the voltage potential supplied to the power terminal (e.g., in response to detection of a conductive liquid being present in the connector)—and subsequent current flows—may help prolong the lifespan of the terminals in the always-on connector, the aspects described herein may be used in other connectors that are sleeping or in a state other than in an always-on state. For example, various versions of the USB specifications (e.g., version 1.0 et seq.) provide for USB Type-A connectors to always provide power and ground to the power and ground terminals, respectively. Having those connectors always in an on state permits external devices to be charged or otherwise supplied with power when connected via the USB connector (e.g., via a USB receptacle on a device). Other versions of the USB specifications permit connectors to sleep when not being used. While a danger of electrolytic and/or galvanic corrosion is lessened while a connector is asleep or otherwise not receiving power on a power terminal, that connector may benefit from being similarly monitored for intrusion of a conductive liquid in the connector. As such, one or more aspects described herein relate to connectors that always receive power from a power source. Examples include Thunderbolt connectors, Lightning connectors, FireWire connectors, Power over Ethernet connectors, and related connectors. One or more other aspects relate to connectors that do not always receive power from the power source. Further, one or more aspects of the disclosure may include checking for unexpected conductivity between terminals by monitoring correlations between voltages of terminals. The unexpected conductivity may include crosstalk between terminals above a correlation threshold.

FIG. 1 illustrates an exploded perspective view of a conformal wearable battery (CWB) 100 according to aspects described herein. Battery cells 101 may be installed into a housing 102 of the CWB. The battery cells 101 may be connected in various combinations (e.g., in series, in parallel, and/or combinations of series and parallel) as desired. The charging and discharging of the battery cells 101 may be controlled by a control system (e.g., a controller with supporting components) contained in a control housing 103. The CWB may include one or more external connections 104 to connect the CWB to one or more CWBs and/or to other systems.

In general, a CWB may include an array of a first quantity of battery cells disposed adjacent to one another in a horizontal direction and a second quantity of battery cells disposed adjacent to one another in a vertical direction. The operation of the CWB may be controlled by one or more controllers as described herein (e.g., as part of the CWB and/or external to the CWB). The array of battery cells may be arranged in a grid-like pattern. Each of the battery cells may be encased or housed in a battery cell housing separate from other battery cells. A battery cell as described herein may include a plurality of individual battery cell elements that are electrically connected to form a compound battery cell that electrically performs as a single unit. Each of the battery cell housings may be physically connected to adjacent battery cell housings by flexible elements (e.g., a flexible printed circuit board), thereby facilitating a surface outline or shape of the array of battery cells to generally conform to a surface outline or shape of a user wearing the CWB assembly. One or more of the battery cell housings may include a positive-charge electrical terminal and a negative-charge electrical terminal that are electrically connected with the battery cell within an interior of the battery cell housing and provide electrical power to electrical devices disposed exterior to the battery cell housing. Electrical terminals of a plurality of the battery cells in the array of battery cells may be connected to route electrical current through the plurality of the battery cells and a set of positive-charge and negative-charge electrical terminals that are shared among the plurality of the battery cells. The positive-charge electrical terminal and the negative-charge electrical terminal may provide an electrical current that passes through an electrically conductive path, for example, through an electronic device, via transfer of electrons through the electrically conductive path between the positive-charge electrical terminal and the negative-charge electrical terminal on the exterior of the battery cell housing. The CWB assembly may include a set of positive-charge and negative-charge electrical terminals that are shared among the plurality of the battery cells of the array of battery cells. The plurality of the battery cells may be electrically coupled together, for example, in series or in parallel or in complex combinations of serial and parallel.

The battery cell housing may be formed of a molded casing. The molded casing may be a sealed case that is formed by a molding process, for example, an injection molding process. The molded casing may be formed of a polymeric material, for example. The casing may be sealed to prevent ingress of solid material and/or liquid material, for example, according to an IP67 rating, IP68 rating, or other ingress protection rating. The casing may feature a seam between two halves or portions of the casing that is sealed to encase the battery cell within the casing. The positive-charge terminal and the negative-charge terminal may each include a conductive region that passes between the interior of the cell housing and the exterior of the cell housing at a seam of the casing. The conductive region may be affixed and electrically connected to the battery cell in an interior of the cell housing at one end, pass through the sealed seam of the casing, and affix to a contact component that electrically couples with electrical devices at an exterior of the cell housing.

A CWB may be worn by a user to power electronic devices that the user carries. The CWB assembly may be subjected to environmental conditions that may cause the CWB (and its housing) to physically deform or bend while also being exposed to moisture. A reliable seal, for example, an IP67 rated seal, may be desirable and beneficial for protection and maintenance of batteries enclosed in environmentally protected housings. Such a battery for powering electronic devices in outdoor environments, for example, in dusty, sandy, rainy, and/or wet environments, may fail early if contaminants such as water, dust, dirt, and/or sand get into the battery enclosed in the housing. A reliable seal may facilitate longer battery life and utility for the user regardless of environmental conditions that the CWB may be subjected. While the CWB may be adequately sealed from the environment, external connectors may be exposed to the environment. One or more aspects relate to reducing degradation of terminals in those external connectors by determining whether a conductive liquid is present and, at least temporarily, disabling power sent to those external connectors, thus reducing and/or preventing electrolytic corrosion of the terminals.

Figure 2:
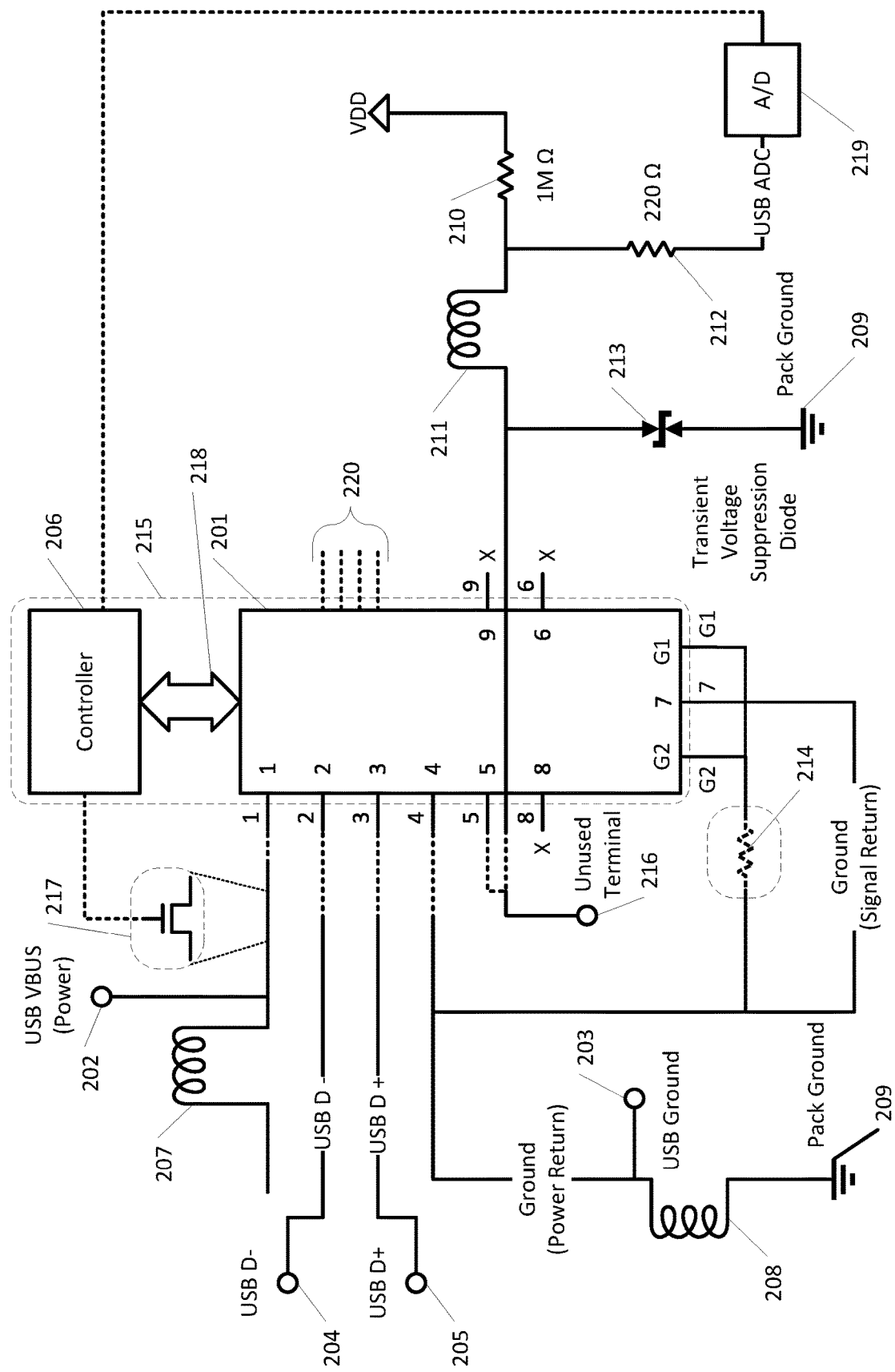
FIG. 2 shows an example circuit for sensing whether a conducting liquid is present in an external connector.

FIG. 2 shows an example circuit for sensing whether a conducting liquid is present in an external connector. As described herein, FIG. 2 provides a circuit connected to a USB Type-A version 3.0+ connector (shown in later figures) with 9 terminals. FIG. 2 includes a USB controller 201 with 9 pins connectable to the terminals of the USB Type-A version 3.0+ connector.

As shown in FIG. 2, pin 1 of the USB the controller 201 is connected to the USB VBUS power terminal 202 of the USB connector. Pin 4 is connected to the USB ground terminal 203 of the USB connector (and grounded to a ground 209 of the battery pack). Pin 2 is connected to a first terminal D− 204 of the data terminals of the USB connector. Pin 3 is connected to a second terminal D+ 205 of the data terminals of the USB connector. As shown in FIG. 2, one or more of the power and/or the ground connections may pass through an inductor 207 and/or inductor 208 to, for instance, reduce noise in the supplied voltage potentials.

The USB controller 201 may include a quantity of unused pins. For instance, where the overall system is designed to support USB specifications 1.0, 2.0, and where the actual USB connector is a connector configured to support USB specification version 3.0+, extra pins may be available in the connector. If not used, those terminals of the connector may be allowed to float as shown by as pins 6, 8, and 9 of USB controller 201 not being connected to the corresponding terminals of the connector. Pin 7 may also be allowed to float, similar to pins 6, 8, and 9, or, as shown in FIG. 2, grounded to the pack ground 209. USB controller 201 may include additional grounds G1/G2, which may also be grounded directly or indirectly (e.g., via an optional resistor 214) to the pack ground 209.

As shown in FIG. 2, the pins 1-9 of the USB controller 201 may be directly connected to the One or more of the unused pins of the USB controller 201, here pin 5, may be connected to, for instance, an unused terminal 216 in the USB Type-A 3.0+ connector. By sensing a voltage on pin 5, the system may determine whether the USB connector is exposed to a conducting liquid. For instance, the voltage of pin 5 may be pulled up to VDD via a relatively larger resistor (e.g. 1 megaohm) with optional inductor 211 and a transient voltage suppression diode 213 (connected to the pack ground 209). With the high resistance of pull-up resistor 210, the voltage of pin 5 may be easily pulled down based on conduction in a conducting fluid between unused terminal 216 and the USB ground terminal 203 in the USB Type-A 3.0+ connector. To sense that voltage change, pin 5 may be tapped via a smaller resistor 212 (e.g., 220 ohms) and fed to an analog-to-digital converter (e.g., USB ADC) 219 where the analog voltage level of the unused terminal 216 may be converted into a digital value. That digital value may then be provided to the system to determine whether an undesired conduction is occurring (e.g., within the presence of a conducting fluid) and, at least temporarily, disabling the power supplied to the USB VBUS power terminal 202.

As described in FIG. 2 and in relation to the other figures, a pull-up resistor is shown pulling a voltage to a predetermined voltage (e.g., VDD or high voltage potential). A pull-down resistor may be used instead to pull the voltage to a different predetermined voltage (e.g., ground or low potential). For the purpose of explanation, this disclosure sets forth examples of the pull-up resistor pulling a voltage up and voltage thresholds set to be below the high voltage. It is appreciated that pull-down resistors may be used instead and the voltage thresholds set to be above the low voltage and is considered part of this disclosure.

The USB controller 201 may be a separate integrated circuit that is connectable to a separate controller 206. Additionally or alternatively, the USB controller 201 may be combined with the separate controller 206 as a larger integrated circuit 215, shown by the dashed outline of controller 215.

Also, the USB controller 201 as shown in FIG. 2 and the controllers in other figures are intended to be general in nature unless otherwise specified. For instance, one or more of the pins 1-9 of the USB controller 201 may represent functional connections to the corresponding terminals of the USB connector where pins 1-9 of the USB controller 201 represent mirrors of pins physically connected to the terminals of the USB connector. Pins 1-9 may be CWB-facing pins and pins 220 may be USB connector-facing pins. For instance, pin 5 may be an access point to the voltage detected on terminal 5 of the USB connector but received by USB controller 201 via another pin (e.g., one of pins 220) where, for instance, the voltage level of terminal 5 of the USB connector is conveyed to the USB controller 201 via connector-facing pins 220 and that voltage provided is mirrored by the USB controller 201. Alternatively, the voltage monitoring circuit described below that monitors the voltage of pin 5 of the USB controller 201 may be directly connected to terminal 5 of the USB connector via a wiring trace or wire before the wiring trace or wire connects to pin 5 of the USB controller 201.

Additionally or alternatively, the pinouts of the USB controller 201 may be the actual pinouts of the USB controller 201 where the pins are connected, via a printed circuit board, to corresponding terminals of a USB connector. For instance, the voltage monitoring circuit described below that monitors the voltage of pin 5 of the USB controller 201 may be directly connected to terminal 5 of the USB connector via a wiring trace or wire before that connection reaches pin 5 of the USB controller 201. In other words, pin 5 of the USB controller 201 may be a single pin that is connected to both the unused terminal 216 of the USB connector and being pulled high by pull-up resistor 210. Alternatively, pin 5 of USB controller 201 may provide access to a separately connected unused terminal 216 of the USB connector, such that the pulled high voltage through pull-up resistor 210 passes through pin 5 of the USB controller 201 before being supplied, through a separate pin (one of pins 220) on USB controller 201 to the unused terminal 216 of the USB connector.

These alternative possibilities are shown by the dashed lines between pins 1-4 of the USB controller 201 and the terminals 202, 204, 205, and 203, respectively. Also the dashed lines between the pin 5 of the USB controller 201, the unused terminal 216, and the pull-up resistor 210 indicate that pin 5 may be directly connected to the unused terminal 216 or may be a mirror of one of pins 220 directed connected to the unused terminal 216. Further, while FIG. 2 is described in relation to pin 5 of a USB Type-A version 3.0+ connector, it is appreciated that any of the other unused pins 6-9 of the USB Type-A version 3.0+ connector may be used in place of or in addition to pin 5 as shown in FIG. 2.

The voltage of pin 5 may be converted via the analog-to-digital converter 219 into a digital representation of the analog voltage of pin 5. The digital representation of the voltage may be sent to controller 206 (and/or controller 215 as described herein). Based on a change detected in the value of the voltage, the controller 206/215 may control the power supplied to terminal 1 (the USB VBUS power terminal) via pin 1 of the USB controller 201/215. The power may be controlled in a variety of different ways. The different ways may be used separately or combined as desired. For example, if combined, the controller 215 may internally regulate the power being supplied to pin 1. If separate from the USB controller 201, the controller 206 may disable power from being supplied to the USB controller 201 (via modification of signals 218 between controller 206 and USB controller 201). Alternatively or additionally, a switch 217 may optionally be provided in the USB VBUS power line attached to pin 1 of the USB controller 201 where the switch 217 may be selectively controlled to enable power to be supplied to or withheld from terminal 1 202 of the USB connector.

Alternatively or additionally, based on the voltage of pin 5 satisfying a voltage threshold, an alert may be generated to a user of the CWB. The alert may identify that one or more connectors have a conducting liquid in them. Alternatively or additionally, the alert may identify which connector has the conducting liquid. Alternatively or additionally, the CWB may include one or more reset buttons or user interfaces to permit the user to reset the connector or connectors (e.g., once the conducting fluid has been cleared from the connector or connectors). Alternatively or additionally, the CWB may include one or more override buttons or user interfaces that permit the user to override the disabling of the connector.

As described herein, monitoring a terminal for a change in voltage may benefit always-on connectors as the risk of electrolytic and/or galvanic corrosion of one or more terminals is higher as a voltage difference exists between various terminals regardless of whether the connector is actively providing power to an external device. On other aspects, monitoring for a voltage change of a terminal in an inactive and/or sleeping connector may be beneficial as well. For instance, it may be beneficial to a user to know whether a given CWB's connector is in the presence of a conductive liquid (and possibly the type of conducting liquid). This permits the user to clear conductive liquid from the connector before the user attempts to connect an external device to the CWB via the connector. As such, while one or more aspects are described in relation to a first terminal always receiving a low voltage, a second terminal being monitored for a voltage change from an initial voltage, and a third terminal always receiving a high voltage, other aspects include embodiments where only one potential (e.g., ground or VDD) is provided to one of the terminals (e.g., the first terminal and/or the third terminal) and the second terminal is monitored for the voltage change.

Figure 3:
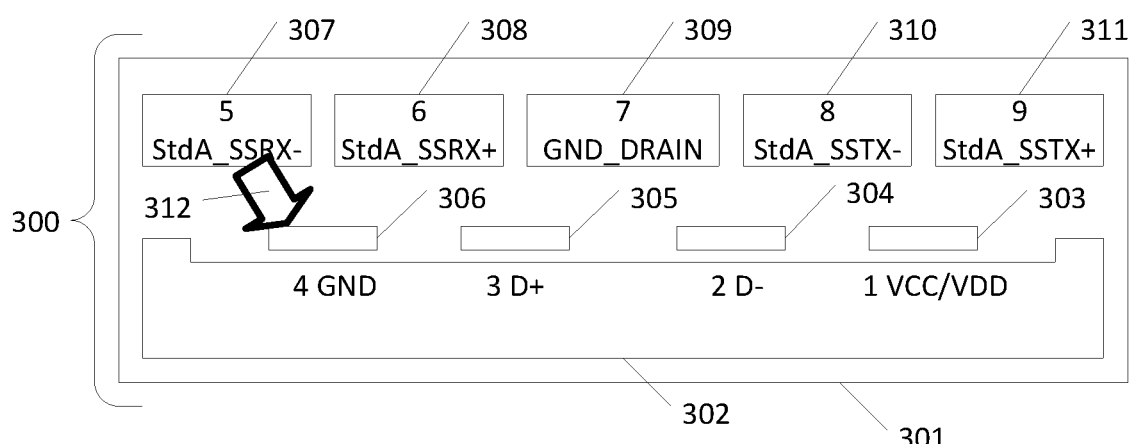
FIG. 3 shows an elevation view of a USB Type-A 3.0 connector showing a first potential conduction path.

FIG. 3 shows an elevation view of a USB Type-A version 3.0+ receptacle showing a first potential conduction path. For the purposes of explanation, the connector of FIG. 3 is shown as a USB receptacle but may alternatively be a USB plug. Unless otherwise specified, a USB connector is intended to be generic for USB receptacles and USB plugs. FIG. 3 shows an example of a USB Type-A 3.0 receptacle having nine pins. The receptacle 300 is shown in FIG. 3 as an end-on view of a USB receptacle. The receptacle 300 may include a conductive shell 301, a plastic insert 302, terminal 1 VCC/VDD 303, terminal 2 D− 304, terminal 3 D+ 305, terminal 4 ground (GND) 306, terminal 5 StdA_SSRX− 307, terminal 6 StdA_SSRX+ 308, terminal 7 GND_DRAIN 309, terminal 8 StdA_SSTX− 310, and terminal 9 StdA_SSTX+ 311. As described with respect to FIG. 2, terminal 5 307 may be pulled high via pull-up resistor 210. USB Type-A version 3.0+ connectors are backward compatible with the USB Type-A version 1.0 and 2.0 connectors that only use four terminals (VCC/VDD, D−, D+, and GND).

With terminal 5 307 pulled high and terminal 4 306 at GND, a voltage difference exists between these two terminals. Where no conductive liquid is present, the voltage on terminal 5 307 remains high. However, in the presence of a conductive liquid and depending on the conductance of the conductive liquid, a conductive path 312 between terminal 5 307 and terminal 4 ground 306 may be created. For example, the impedance of the conductive path 312 may be inversely proportional to the available ions in the conductive liquid. Where the conductive liquid is distilled water, the impedance is high as distilled water contains relatively few ions. Where the conductive liquid is brackish water, the impedance is lower due to an increase in ions. Where the conductive liquid is salt water, the impedance is even lower based on the ions available for conduction.

When the terminals 303-311 of the USB Type-A 3.0 receptacle of FIG. 3 are new and, for instance, plated or coated in a non-corrosive material (e.g., gold), the existence of conduction between the terminals may be of little consequence as the non-corrosive surface is non-reactive to the exposed ions. However, over time, as the plating or coating on the terminals begin to wear away, the reactive conductors (e.g., copper or other conductive material) may be exposed. In the presence of the conductive liquid, electrolytic and/or galvanic corrosion may start to degrade the exposed conductive material of the terminal. The corrosion may form an oxide with a higher impedance than that of the conductor or the non-corrosive plating/coating. That higher impedance may adversely modify the operation of the CWB by, for instance, losing power to heat from the increased resistance and/or reducing the quality of signals exchanged across the USB connector. Further, the corrosion may eat away at the conductor itself until the conductor breaks off or is consumed. Accordingly, detecting the undesired conduction may permit power to be removed or reduced until the conducting liquid is removed.

FIG. 4 shows a plan view of the USB Type-A 3.0+ receptacle of FIG. 3 showing the first potential conduction path and possible additional conduction paths. The 9 terminals of FIG. 4 include terminal 1 403, terminal 2 404, terminal 3 405, terminal 4 406, terminal 5 407, terminal 6 408, terminal 7 409, terminal 8 410, and terminal 9 411. The conduction path 312 of FIG. 3 is shown as conduction path 412 in FIG. 4. Conduction paths 413 (shown in unfilled arrows with dashed lines) represent examples of other unused terminals 6, 8, and 9 of the USB Type-A version 3.0 receptacle of FIG. 3 being pulled high and their voltage levels monitored for reductions. Additionally or alternatively, those terminals (including terminal 5) may be pulled low and their voltages monitored for possible increases based on the existence of conduction paths 414 (shown in filled arrows with dashed lines). With respect to conduction paths 414, the arrows represent conduction between USB VBUS power terminal 1 403 (at VDD) to the unused pins 407-408 and 410-411. Further, while terminal 7 409 is shown in FIG. 3 as connected to ground, it may be instead pulled low via a larger resistor and monitored for a voltage change as well via, for instance, one of conduction paths 414. Further, irrespective of whether terminal 1 403 is at a high voltage terminal 4 406 is at ground, one or more of the unused terminals 407-411 may be set at a high or low value and the remaining terminal or terminals be pulled high and/or low for monitoring.

Figure 5:
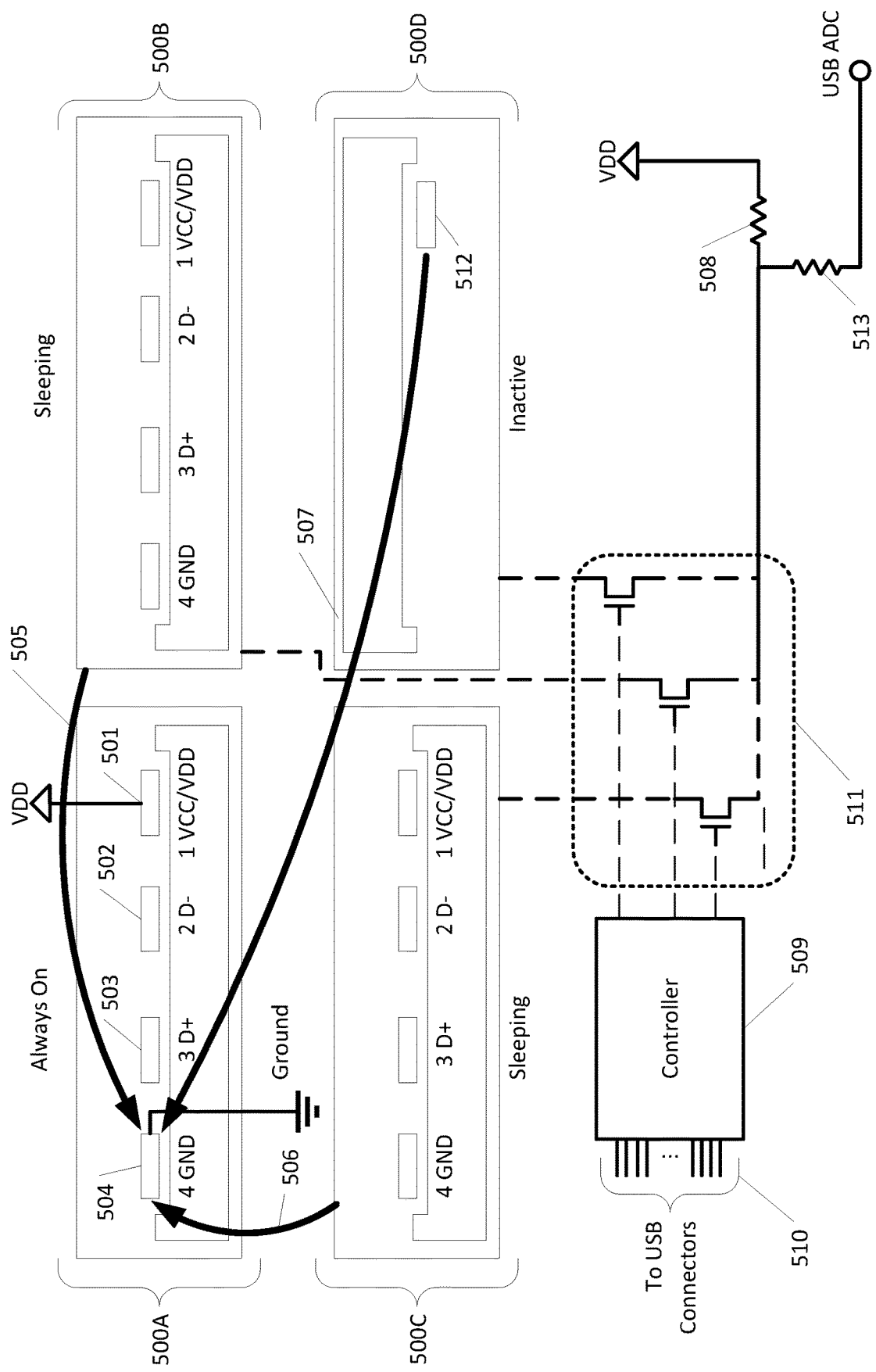
FIG. 5 an elevation view of multiple USB Type-A version 1.0/2.0 connectors showing various conduction paths between the different connectors.

FIG. 5 an elevation view of multiple USB Type-A version 1.0/2.0 receptacles showing various conduction paths between the different connectors. FIGS. 2-4 refer to USB Type-A version 3.0+ receptacles having unused terminals. Aspects of the disclosure may be applied to earlier versions of the USB Type-A receptacles that include only four terminals. FIG. 5 includes a first USB Type-A receptacle 500A that always receives power (always on or in an active state) and other USB Type-A receptacles that may be either sleeping 500B/500C and/or a dummy receptacle 500D (labeled in FIG. 5 as inactive). USB Type-A receptacle 500A includes terminal 1 501, terminal 2 502, terminal 3 503, and terminal 4 504 with terminal 1 501 providing power at VDD and terminal 4 504 attached to ground. As the other USB Type-A receptacles 502-504 are sleeping or inactive, one or more of their terminals may be used and pulled high or low via a pullup or pulldown resistor, respectively, and that terminal's voltage level monitored for change.

With respect to USB Type-A receptacle 500D, only one terminal 512 is shown. USB Type-A receptacle 500D may be an inactive USB Type-A receptacle to physically connect to, but not supply power to, a device having a USB Type-A plug. For instance, in hostile environments, mud, sand, dirt, dust, and/or other substances may enter a USB receptacle and interfere with good connections between a plug and receptacle. One solution is to provide protective caps for each of the unused plugs. FIG. 5 provides an example where the unused plugs may be kept clean by inserting them into inactive USB receptacles. The inactive USB receptacles may have no terminals, one terminal 512 connected to ground, or a full set of terminals that are not connected to pins of a controller. An advantage of providing one or more unconnected terminals may include permitting the mechanical wiping action of the plug's terminals to clean themselves against the receptacle's unconnected terminals during insertion into and withdrawal from the inactive receptacle, regardless of any power or signals being actively applied to the terminals. To permit a user to appreciate that a given receptacle is inactive compared to others, the receptacle may be oriented in a different direction than the other receptacles (in FIG. 5, receptacle 500D is inverted relative to each of receptacles 500A, 500B, and 500C). Further, other types of connectors may be used in conjunction or in lieu of the connectors of FIG. 5 including but not limited to USB Type-C connectors, RJ45/Ethernet, Thunderbolt, Lightning and other types of connectors.

FIG. 5 shows conduction paths 505, 506, and 507 between ground terminal 504 of the always on USB Type-A receptacle 500A and the monitored terminals of the sleeping or inactive USB Type-A receptacles 500B, 500C, and/or 500D where the monitored terminals are pulled high. Similarly, conduction paths (not shown) may exist where the monitored terminals are pulled low to terminal 1 VDD 501.

FIG. 5 also shows a controller 509 (e.g., controller 201 and/or 215 of FIG. 2), with pins 510 connected to terminals of various USB receptacles, controlling one or more of the monitored terminals of receptacles 500B-500D to be pulled high via pull-up resistor 508 and one or more switches 511 connecting the monitored terminal or terminals to the pull-up resistor 508. The monitored terminal or terminals may be monitored via a lower ohm resistor 513 connected to, for instance, an analog-to-digital converter and/or other monitoring circuits. Here, receptacle 500A and one or more of receptacles 500B-500D may be submerged in a conducting liquid where the conduction occurs, via the conducting liquid, between the receptacle 500A and one or more of the other receptacles that is also submerged in the conducting liquid.

FIG. 6 is a table of sample voltage level readings relating to voltages between terminals of a connector immersed in different environments. For each, initial voltages and settled voltages are shown. For example, when initially placed in the conducing liquid, a voltage of the monitored terminal may drop then rise after a short interval (e.g., a few milliseconds to a few seconds). The initial voltage and settled voltages are shown by way of example. Also, a result of the conversion of the analog voltage level to a digital representation is shown in the final column. With no liquid as an initial condition, the initial voltage of the monitored terminal is 3.15 V (with, for instance, a supply voltage of approximately 3.15 V) and the settled voltage of the monitored terminal is 3.15 V. A resultant output of the 3.15 V being converted by an analog to digital converter is 0x1BA. When the same receptacle is subjected to distilled water (having few conductive ions), the initial voltage on the monitored line is ~1.70 V and the settled voltage is ~1.90 V. The ADC reading of the settled voltage is 0x170. When the receptacle is subjected to tap water (having more conductive ions, e.g., 0.5 grams table salt per 1,000 grams of water), the initial voltage on the monitored line is ~0.90 V and the settled voltage is ~1.30 V. The ADC reading of the settled voltage is 0x14A. When the receptacle is subjected to brackish water (e.g., roughly half the salinity of salt water or ~17 grams table salt per 1,000 grams of water), the initial voltage on the monitored line is ~0.52 V and the settled voltage is ~0.54 V. The ADC reading of the settled voltage is 0x0A3. When the receptacle is subjected to salt water (e.g., —35 grams table salt per 1,000 grams of water), the initial voltage on the monitored line is ~0.46 V and the settled voltage is ~0.48 V. The ADC reading of the settled voltage is 0x093. In short, the initial introduction of the conducting liquid resulted in an initial voltage drop followed by a rise in the voltage of the monitored terminal.

FIG. 7 shows a sample table of voltage threshold values relating to the voltages of FIG. 6 and possible threshold times. A first column may include the various voltage thresholds, a second column may include a condition relating to a respective voltage threshold, and additional columns relating to possible time thresholds associated with the various thresholds. The time thresholds may be used to determine how long a voltage should be at that voltage level before adjusting supplied power to or disabling communication via a connector. In FIG. 7, the times X seconds for time threshold set A are all the same. Here, with this time threshold set A, no variation in the time thresholds are used. Rather, all time thresholds are the same (e.g., no time threshold or a few seconds or longer). For time threshold set B, two times thresholds are shown: Y seconds and Z seconds. The time thresholds Y and Z may be selected to account for how the voltage of a monitored line changes over time. If a voltage drops quickly and remains there for a short time Y (e.g., 1-2 seconds), that voltage reading may be equivalent to a higher voltage that remains at the higher voltage for a longer time Z (e.g., 5-6 seconds). Accordingly, one or more voltages and/or one or more time thresholds may be used to determine a composition of a conducting liquid in the connector and, based on the determined type of liquid, a relevant action may be taken (e.g., shutting off power to a connector, disabling a connector, etc. for a period or until a user resets the CWB or connector or the like).

Figure 8:
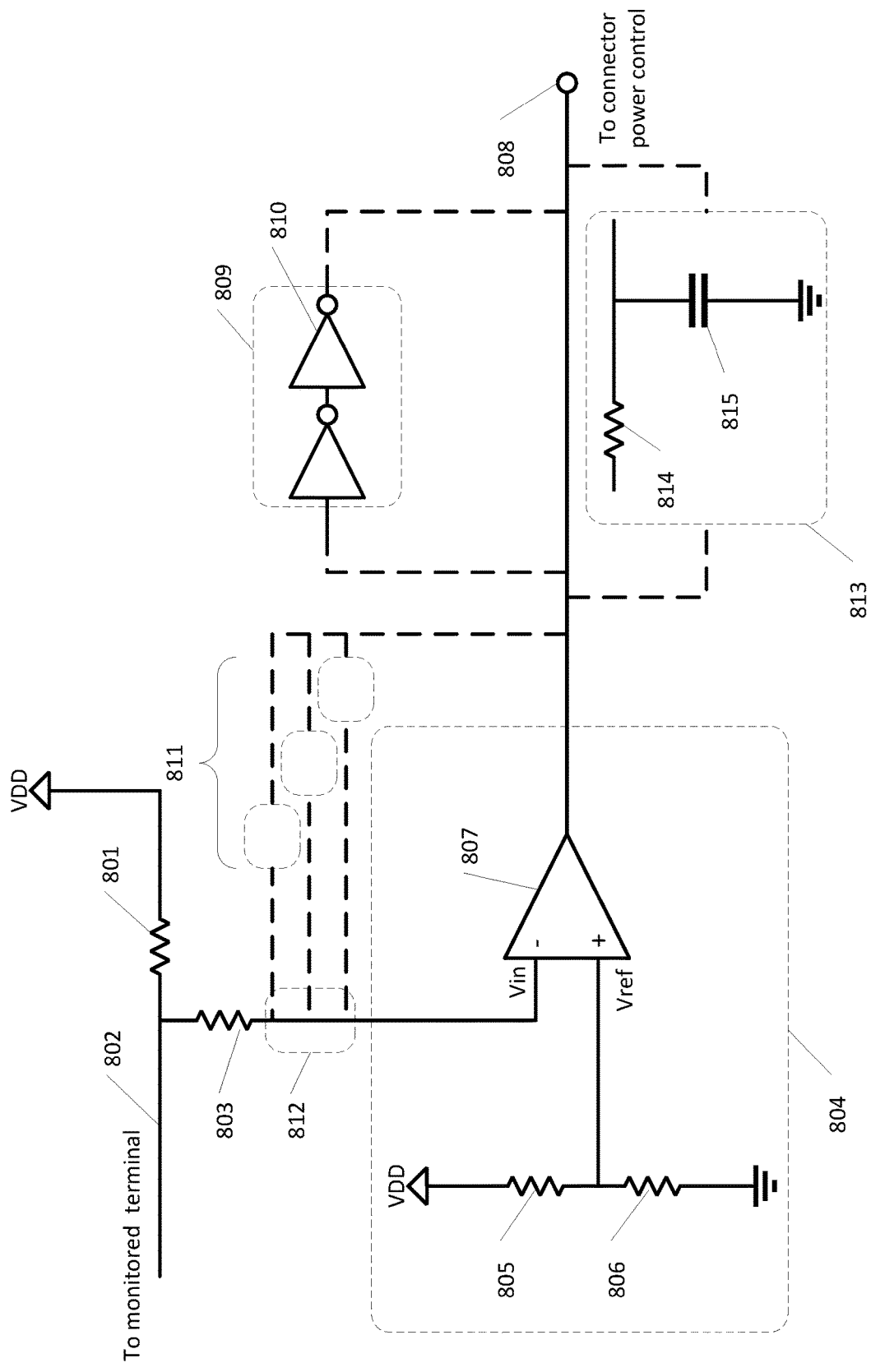
FIG. 8 shows an example circuit for sensing whether conduction has reached one or more conduction thresholds.

FIG. 8 shows an example circuit for sensing whether conduction has reached one or more conduction thresholds. FIG. 8 shows a pull-up resistor 801 pulling up a line 802 connected to a monitored terminal (not shown). The line 802 is monitored to determine whether a voltage on line 802 drops below a predetermined threshold. A detector 804 may be used to determine whether the voltage on the monitored terminal drops below a predefined threshold. The detector 804 is connected to the monitored line 802 through resistor 803. The detector 804 of FIG. 8 may be referred to as a threshold monitoring circuit and may include a comparator 807 with resistors 805 and 806 forming a voltage divider. The voltage divider provides a voltage threshold Vref at the positive input of the comparator 807 and the voltage from the monitored line 802 as a negative input of the comparator. When the voltage of the monitored line 802 is above the reference voltage Vref, the output of the comparator is low. However, where the voltage of the monitored line 802 falls below the reference voltage Vref, the output of the comparator is high. Based on the output voltage being high, the power supplied to the USB receptacle may be adjusted or shut off as desired. In a first example, the output of the detector 804 is shown as output 808 connected to a power control circuit (not shown).

The power supplied to the USB receptacle, e.g., via terminal 1 VCC/VDD 303, may be turned off by grounding terminal 1 303 or permitting it to float. Additionally or alternatively, the voltage provided to terminal 1 303 may be reduced. The reduction may be for a fixed interval (e.g. a few seconds, a few minutes, etc.) and then restored to the original VCC/VDD voltage level. If the detector continues to detect the conducting liquid in the connector, the voltage on terminal 1 303 may be again reduced. In other words, the voltage applied to terminal 1 303, when a conducting liquid triggers the detector 804, may be reduced until the detector no longer detects the conductive liquid in the connector. Additionally or alternatively, the reduction may last until a separate reset is received by the controller. Additionally or alternatively, while a voltage level of terminal 1 303 may remain constant at VCC/VDD, the power available from terminal 1 303 may be reduced by only providing the voltage VCC/VDD for a small portion of time and then providing the ground potential. For example, when the detector detects the conductive liquid in the connector, the terminal 1 303 may provide the voltage at VCC/VDD with a duty cycle (e.g., ratio of the pulse width to the period of the waveform) of 0.1%, 1%, 5%, 10%, 20%, or other ratios as desired.

FIG. 8 further shows one or more optional additional detectors 811 that may include comparators similar to comparator 807 but being supplied with different voltage thresholds (e.g., the voltage thresholds of FIG. 7). The additional detectors 811 may operate in parallel, providing their outputs 808 to the power control circuit. The outputs 808 may be combined or provided separately to the power control circuit.

In one example, detectors 804 and 811 may operate at the same time. Alternatively, the detectors 804 and 811 may be individually enabled via switch 812. Switch 812 may comprise a manual switch (e.g., jumpers, dual-inline package (DIP) switches, and the like) or programmatically controlled switch (e.g., a multiplexor) or a combination of manual and programmatically controlled switches. Alternatively, switch 812 may permit adjustment of a voltage threshold (e.g., Vref) of comparator 807.

A benefit of having one or more detectors with different voltage thresholds and the ability to switch between them (or an adjustable voltage threshold) includes being able to customize the sensitivity of the system providing power to the connector. For instance, the sensitivity to conductive liquids may be adjusted to comport with its location. If the system is to be used in a saltwater-free environment with low humidity, the system may be set to be more sensitive as the likelihood of conductive liquids in that environment is small. However, if the system is to be used in a humid environment (where the connector may be exposed to a person's perspiration) or near saltwater, the likelihood of a conductive liquid contacting the connector is higher and, to improve usability of the system, the sensitivity of the system may be reduced.

FIG. 8 may include one or more delay circuits 809 and/or 813. The delay circuits 809/813 may be used to delay the propagation of the output of the detector 804 before that output is passed to the connector power control via output 808. The delay circuit 809 may include one or more sets of inverters 810. The delay circuit 809 operates based on the switching delay encountered by stacked inverters. The delay circuit 813 may include a resistor-capacitor RC timing circuit (formed by resistor 814 and capacitor 815). Upon a change from a low saturation output of detector to a high saturation output, the delay circuit 813 delays the propagation of the output of detector 804 by charging the capacitor 815 before the output 808 reaches a high saturation level.

Figure 9:
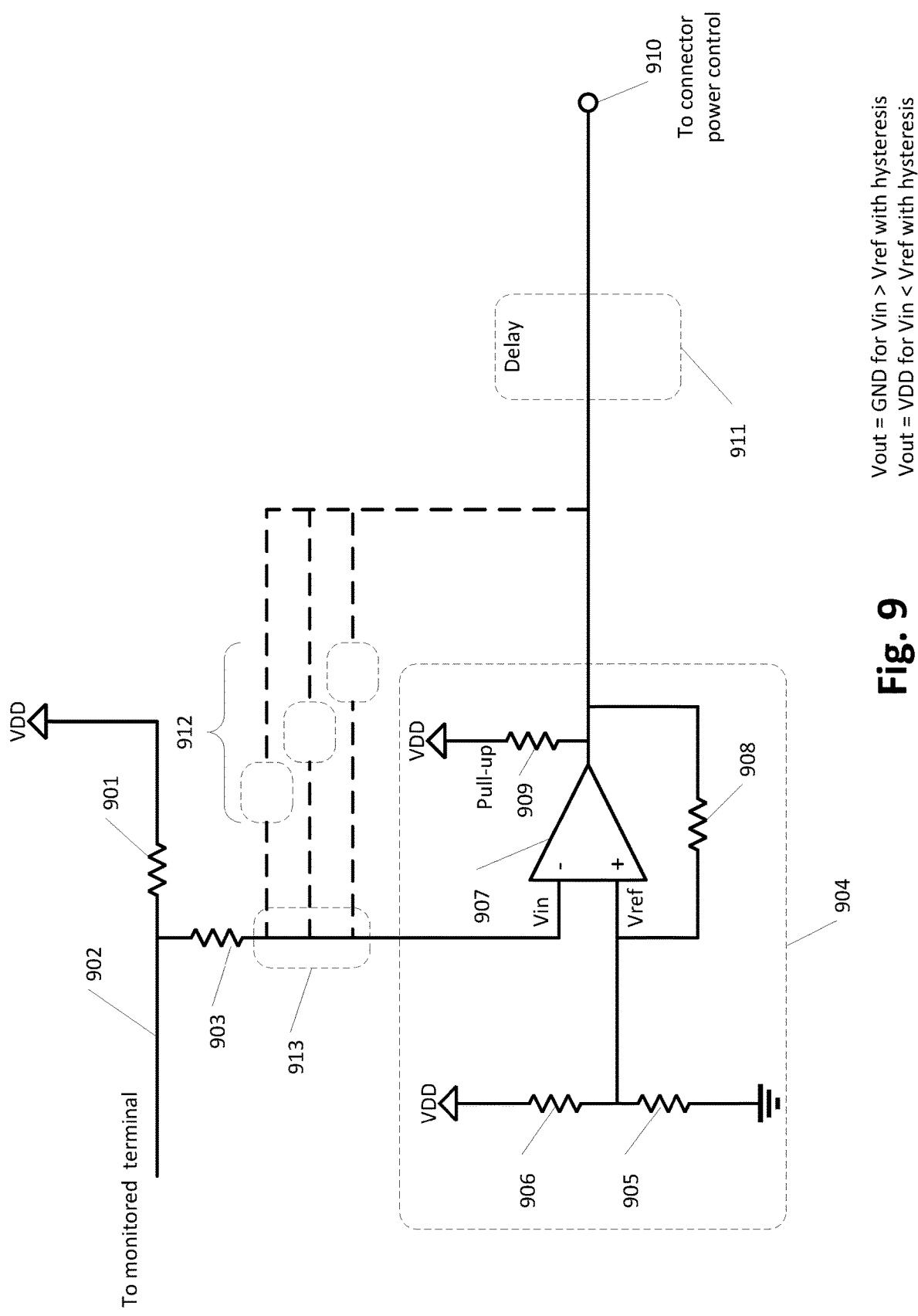
FIG. 9 shows another example circuit for sensing whether conduction has reached one or more conduction thresholds.

The comparator 807 is shown without feedback. FIG. 9 provides an example of a detector with a comparator with positive feedback. FIG. 9 includes a pull-up resistor 901 between a voltage supply VDD and a monitored terminal 902. A voltage of the monitored terminal may be provided to a detector 904 via a resistor 903. The detector 904 may include a voltage divider formed from resistors 905 and 906. The voltage divider may output a reference voltage Vref that may be provided to a non-inverting input of a comparator 907. The voltage of the monitored terminal 902 may be provided to the inverting input of the comparator 907. An output 910 of the comparator 907 may be pulled up via a pull up resistor 909 and fed back, via resistor 908, to the non-inverting input of the comparator 907. Using the positive feedback of resistor 908, the comparator 907 may be controlled to exhibit hysteresis. When the voltage of the monitored terminal 902 is high (above Vref), the inverting input of the comparator 907 is higher than the non-inverting input and the output 910 of the comparator 907 saturates low. As the voltage of the monitored terminal 902 falls below Vref by a small voltage (e.g., 0.01-0.5 V or lower or higher as desired), the output 910 of the comparator 907 switches and saturates high. As the voltage of the monitored terminal 902 climbs above Vref by the small voltage (e.g., 0.01-0.5 V or other value specified above), the output of the comparator 907 switches again and saturates low. The hysteresis of the detector 904 may reduce the quantity of transitions between providing voltage or power to the connector and not being provided to the connector. For instance, if the voltage of the monitored terminal is fluctuating near a voltage threshold of FIG. 7, the hysteresis of the detector 904 of FIG. 9 may permit the detector to 904 to turn off or on but to stay in that state until the voltage of the monitored terminal changes by a greater amount than the fluctuations. Similar to FIG. 8, FIG. 9 optionally includes one or more detectors 912 with different voltage thresholds operating in parallel or selectively controlled via switch 913. FIG. 9 may further optionally include delay 911 similar to one or more of the delay circuits 809 and/or 813 of FIG. 8.

Figure 10:
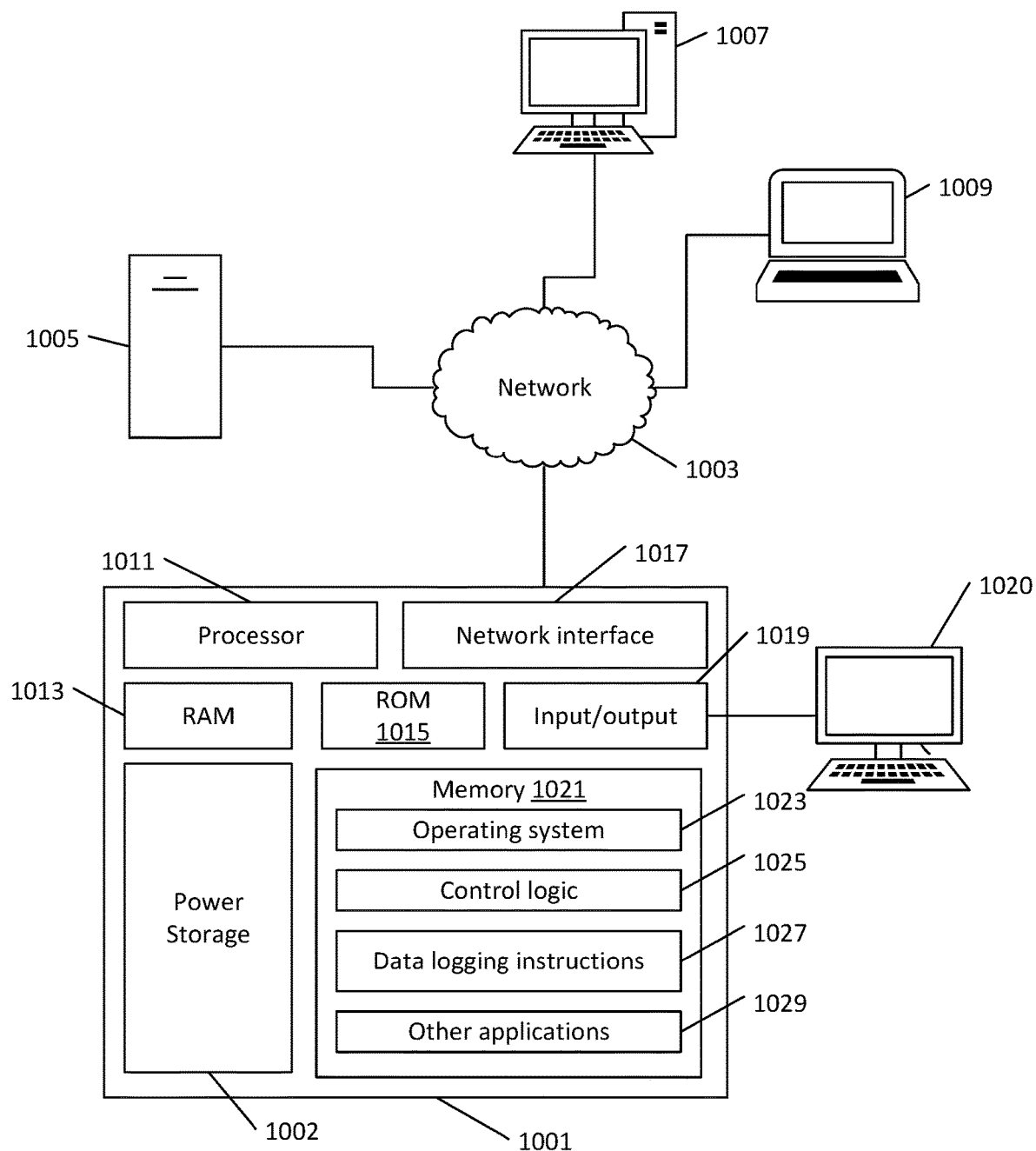
FIG. 10 shows an illustrative operating environment in which various aspects of the disclosure may be implemented.

FIG. 10 illustrates one example of a device 1001 that may be used to implement one or more illustrative aspects discussed herein. For example, the device 1001 may be a CWB comprising a power storage 1002 (e.g., one or more arrays of batteries) and a processor 1011). The device 1001 may, in some embodiments, implement one or more aspects of the disclosure by reading and/or executing instructions and performing one or more actions based on the instructions. In some embodiments, the device 1001 may be a stand-alone CWB and/or be incorporated into a larger network of various devices such as a desktop computer, a computer server, a mobile device (e.g., a laptop computer, a tablet computer, a smart phone, any other types of mobile computing devices, and the like), and/or any other type of data processing device.

The device 1001 may, in some embodiments, operate in a standalone environment. In others, the device 1001 may operate in a networked environment. As shown in FIG. 10, various network nodes 1001, 1005, 1007, and 1009 may be interconnected via a network 1003, such as the Internet. Other networks may also or alternatively be used, including private intranets, corporate networks, LANs, wireless networks, personal networks (PAN), and the like. Network 1003 is for illustration purposes and may be replaced with fewer or additional computer networks. A local area network (LAN) may have one or more of any known LAN topologies and may use one or more of a variety of different protocols, such as Ethernet. Devices 1001, 1005, 1007, 1009, and other devices (not shown) may be connected to one or more of the networks via twisted pair wires, coaxial cable, fiber optics, radio waves, or other communication media. Additionally or alternatively, the device 1001 and/or the network nodes 1005, 1007, and 1009 may be a server hosting one or more databases.

As seen in FIG. 10, the device 1001 may include a processor 1011, RAM 1013, ROM 1015, network interface 1017, input/output interfaces 1019 (e.g., keyboard, mouse, display, printer, etc.), and memory 1021. Processor 1011 may include one or more computer processing units (CPUs), graphical processing units (GPUs), and/or other processing units such as a processor adapted to perform computations associated with database operations. Input/output interfaces 1019 may include a variety of interface units and drives for reading, writing, displaying, and/or printing data or files. Input/output interfaces 1019 may be coupled with a display such as display 1020. Memory 1021 may store software for configuring device 1001 into a special purpose computing device to perform one or more of the various functions discussed herein. Memory 1021 may store operating system software 1023 for controlling overall operation of the device 1001, control logic 1025 for instructing the device 1001 to perform aspects discussed herein, data logging instructions 1027, and other applications 1029. Control logic 1025 may be incorporated in and may be a part of the data logging instructions 1027. In other embodiments, the device 1001 may include two or more of any and/or all of these components (e.g., two or more processors, two or more memories, etc.) and/or other components and/or subsystems not illustrated here.

Devices 1005, 1007, 1009 may have similar or different architecture as described with respect to the device 1001. Those of skill in the art will appreciate that the functionality of the device 1001 (or device 1005, 1007, 1009) as described herein may be spread across multiple data processing devices, for example, to distribute processing load across multiple computers, to segregate transactions based on geographic location, user access level, quality of service (QoS), etc. For example, devices 1001, 1005, 1007, 1009, and others may operate in concert to provide parallel computing features in support of the operation of control logic 1025 and/or data logging instructions 1027.

One or more aspects discussed herein may be embodied in computer-usable or readable data and/or computer-executable instructions, such as in one or more program modules, executed by one or more computers or other devices as described herein. Generally, program modules include routines, programs, objects, components, data structures, etc. that perform particular tasks or implement particular abstract data types when executed by a processor in a computer or other device. The modules may be written in a source code programming language that is subsequently compiled for execution, or may be written in a scripting language such as (but not limited to) Python or JavaScript. The computer executable instructions may be stored on a computer readable medium such as a hard disk, optical disk, removable storage media, solid-state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects discussed herein, and such data structures are contemplated within the scope of computer executable instructions and computer-usable data described herein. Various aspects discussed herein may be embodied as a method, a computing device, a data processing system, or a computer program product. Having discussed several examples of computing devices which may be used to implement some aspects as discussed further below, discussion will now turn to a method for streamlining how permissions may be obtained for reusing data across different platforms.

The network 1003 may include one or more wired and/or wireless networks. For example, network 1003 may include a cellular network (e.g., a long-term evolution (LTE) network, a code division multiple access (CDMA) network, a 3G network, a 4G network, a 5G network, another type of next generation network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks. The number and arrangement of devices and networks shown in FIG. 10 are provided as an example. In practice, there may be additional devices and/or networks, fewer devices and/or networks, different devices and/or networks, or differently arranged devices and/or networks than those shown in FIG. 10.

Figure 11:
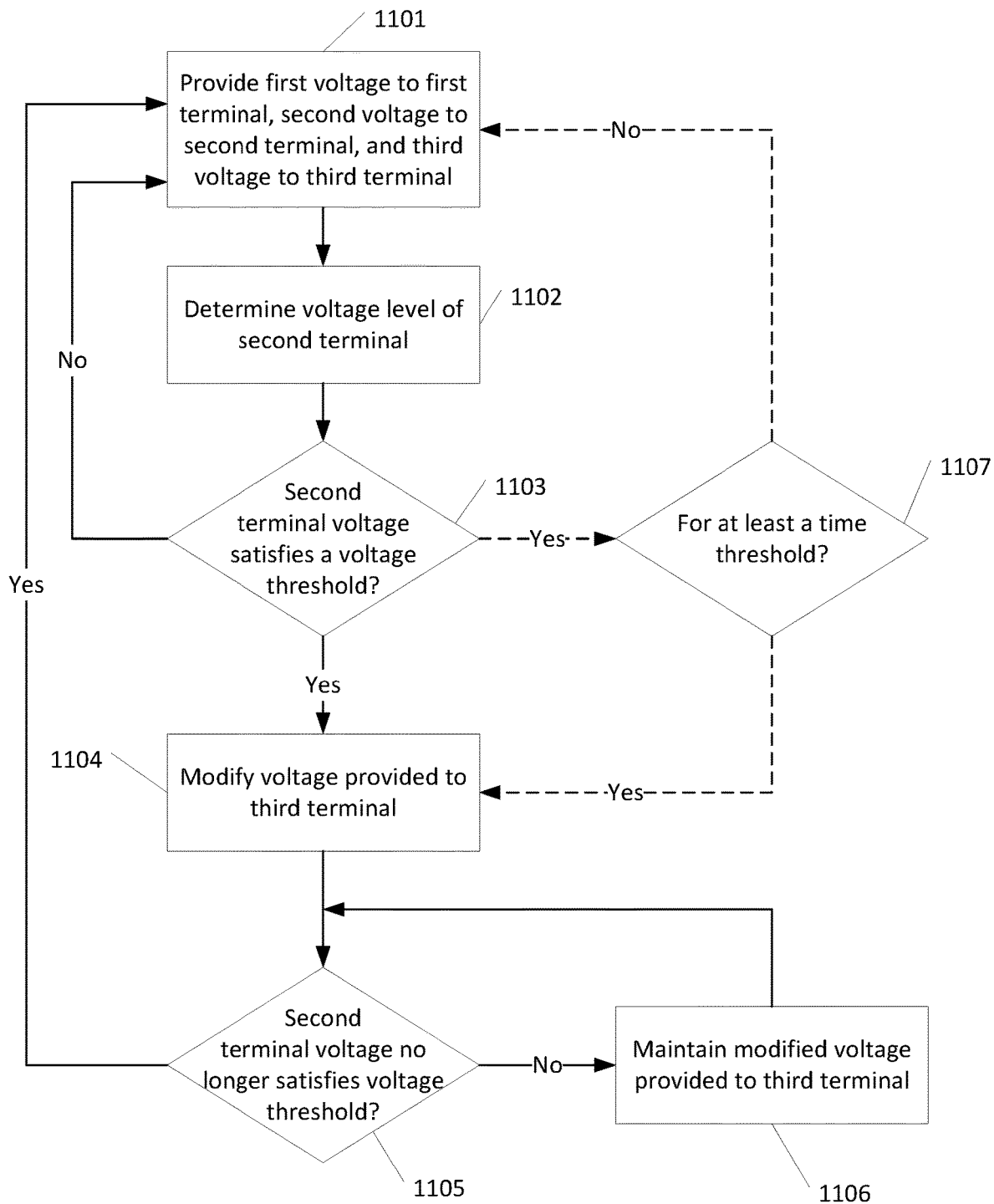
FIG. 11 is a flowchart showing a first process for controlling a voltage applied to a connector based on a detection of conduction between connector terminals.

FIG. 11 is a flowchart showing a first process for controlling a voltage applied to a connector based on a detection of conduction between connector terminals. In step 1101, a first voltage is provided to a first terminal, an initial second voltage is provided to a second terminal, and a third voltage is provided to a third terminal. The voltages may be different or two of the voltages may initially be the same. In step 1102, a voltage detector determines a voltage level of a second terminal. In step 1103, the system determines whether the voltage of the second terminal satisfies a voltage threshold. In the case where a voltage of the monitored terminal drops in the presence of a conducting liquid, the voltage threshold may be a voltage below a normally high voltage level of the monitored terminal. If the monitored terminal is normally low, the voltage threshold would be above the low voltage. If the system determines in step 1103 that the voltage of the second terminal satisfies the voltage threshold, then, in step 1104, the system modifies the voltage provided to a third terminal. If the system determines in step 1103 that the voltage of the second terminal did not satisfy the voltage threshold, then the process returns to step 1101. Here, the first terminal may be a USB Type-A terminal 4 GND terminal. The second terminal may be a USB Type-A terminal 5 of the version 3.0+ USB specifications. The third terminal may be a USB Type-A terminal 1 VCC/VDD terminal.

In step 1105, the system determines whether the voltage of the second terminal no longer satisfies the voltage threshold. If the voltage of the second terminal continues to satisfy the voltage threshold, then in step 1106 the modified voltage on the third terminal is maintained. If the voltage of the second terminal no longer satisfies the voltage threshold, then the process returns to step 1101 and the voltages applied to the terminals. FIG. 11 may operate as described above. Optionally, if in step 1103, it was determined that the voltage of the second terminal satisfied the voltage threshold, then in step 1107 the system may determine whether the voltage threshold was exceeded for at least a time threshold. If the time threshold was not exceeded, then the process returns to step 1101. If the time threshold was exceeded, then the process modifies the voltage of the third terminal in step 1104.

Figure 12:
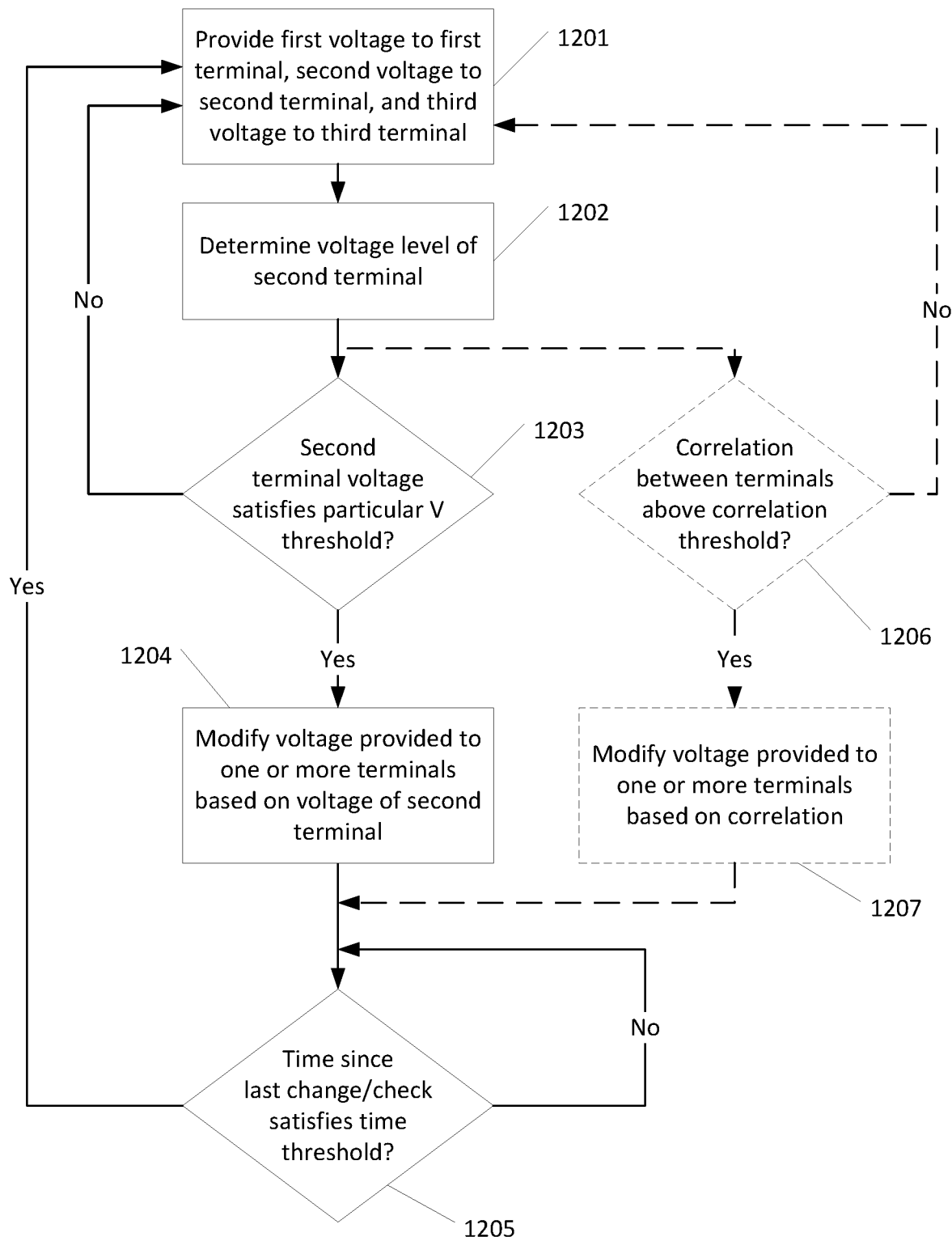
FIG. 12 is a flowchart showing a second process for controlling a voltage applied to a connector based on a detection of conduction between connector terminals.

FIG. 12 is a flowchart showing a second process for controlling a voltage applied to a connector based on a detection of conduction between connector terminals. In step 1101, a first voltage is provided to a first terminal, an initial second voltage is provided to a second terminal, and a third voltage is provided to a third terminal. The voltages may be different or two of the voltages may initially be the same. In step 1202, a voltage detector determines a voltage level of a second terminal. In step 1203, the system determines whether the voltage of the second terminal satisfies a voltage threshold. In the case where a voltage of the monitored terminal drops in the presence of a conducting liquid, the voltage threshold may be a voltage below a normally high voltage level of the monitored terminal. If the monitored terminal is normally low, the voltage threshold would be above the low voltage. If the system determines in step 1203 that the voltage of the second terminal satisfies a particular voltage threshold, then, in step 1204, the system modifies the voltage provided to a third terminal based on the particular voltage threshold satisfied by the voltage of the second terminal. For instance, if the voltage of the second terminal satisfies a first voltage threshold, then the modification in step 1204 of the voltage provide to the third terminal may be modified by a first amount (reduced by a partial amount). If the voltage of the second terminal satisfies a second voltage threshold, then the modification in step 1204 of the voltage provide to the third terminal may be modified by a second amount or way (reduced significantly or grounded). If the system determines in step 1203 that the voltage of the second terminal did not satisfy any of the voltage thresholds, then the process returns to step 1201. Here, the first terminal may be a USB Type-A terminal 4 GND terminal. The second terminal may be a USB Type-A terminal 5 of the version 3.0+ USB specifications. The third terminal may be a USB Type-A terminal 1 VCC/VDD terminal.

In step 1205, the system determines whether the voltage of the second terminal has satisfied the particular voltage threshold for at least a time threshold. If the time threshold has not been satisfied, then the process returns to step 1205 until the time threshold has been satisfied. Once the time threshold has been satisfied, the process returns to step 1201.

With respect to FIG. 3, a voltage of terminal 5 307 may be monitored by the controller. When the D+ terminal 3 305 is floating or at a low voltage level, the D+ terminal 3 305 may have little to no effect on the voltage of terminal 5 307. However, when the voltage of the D+ terminal 3 305 is varying—e.g., when transmitting or receiving data, the high voltage state of D+ terminal 3 305 may temporarily increase the voltage of terminal 5 307 such that the voltage of terminal 5 307 does not satisfy the voltage threshold of step 1203 and the modification of one or more voltages of step 1204 does not occur. To account for this possibility, an additional and/or alternative monitoring processes may be performed as shown in dashed lines in FIG. 12. For instance, a correlation between terminals may be monitored by the controller in step 1206. Referring to FIG. 3, a correlation between the voltage changes of terminal 5 307 and the voltage changes of D+ terminal 3 305 may be determined in step 1206. One or more correlation thresholds may be obtained similar to the list of voltage thresholds of FIG. 7. The correlation between the terminals may be compared against the correlation thresholds to determine whether crosstalk between the terminals is unexpected. The unexpected crosstalk may be due to a short (e.g., a piece of metal bridging the terminals) or may be due to a conductive fluid permitting conduction between the terminals. If the correlation determined in step 1206 satisfies a correlation threshold, then the voltage or voltages provided to the terminals may be modified in step 1207 (e.g., attenuated or temporarily stopped) and then reevaluated in step 1205. Alternatively or additionally, the user may be alerted in step 1207 to the presence of abnormal crosstalk/presence of a conducting fluid. The user may wish for the CWB to continue providing power so step 1207 may only alert the user of the issue and continue to provide power despite the presence of the conducting fluid. If the correlation determined in step 1206 does not satisfy the correlation threshold, then the process may return to step 1201.

While aspects of the disclosure have been described with reference to battery cells and/or a CWB comprising battery cells and the control of terminals in connectors, arrangements and methods as described herein may also be applied to other devices and systems having external connectors. Examples of such electronic devices may include underwater cameras, sonar devices, radar devices, lidar devices, emergency radio beacons, satellite communications devices, terrestrial wireless communications devices, global positioning system (GPS) receivers, electronic environmental sensor devices, electronic medical devices, computing processors, solar cell based power generation devices, wave motion based power generation devices, fuel cell based power generation devices, battery charging controllers, and/or portable chemical batteries for powering electronic or electrical devices.

A rechargeable conformal wearable battery (CWB) may be worn by a user to power electronic devices that the user carries. The CWB may be subjected to a multitude of environmental conditions such as harsh shock and vibration, moisture exposure, and extreme temperatures. The CWB may have a housing that is sealed to facilitate longer battery life and utility for the user regardless of environmental conditions it may encounter. To provide a desired power output, the CWB may include a plurality of battery cells, each with a rated power capacity and when electrically connected, may allow the CWB to provide a desired power output.

A rechargeable conformable wearable battery (CWB) assembly may be worn by a user to power electronic devices that the user carries. The CWB assembly may be subjected to environmental conditions that the user is also subjected to. The CWB may have a sealed housing that is sealed to facilitate longer battery life and utility for the user regardless of environmental conditions that the CWB may encounter. To provide a desired power output, the CWB may include a plurality of battery cells, each with a rated power capacity and when electrically connected, may allow the CWB to provide a desired power output and within a specified size range and/or weight range.

Many illustrative embodiments are listed below in accordance with one or more aspects disclosed herein. Although many of the embodiments listed below are described as depending from other embodiments, the dependencies are not so limited. For example, embodiment #5 (below) is expressly described as incorporating the features of embodiment #1 (below), however, the disclosure is not so limited. For example, embodiment #5 may depend any one or more of the preceding embodiments (i.e., embodiment #1, embodiment #2, embodiment #3, and/or embodiment #4). Moreover, that any one or more of embodiments #2-#10 may be incorporated into embodiment #1 is contemplated by this disclosure. Likewise, any of embodiments #1, 11, and 15 may be combined with one or more of the features recited in embodiments #2-10 and/or 12-14, and 16-20. Further likewise, embodiments #21, #38, and #40 may be combined with one or more of the features recited in embodiments #22-37 and 39. Further likewise, any of embodiments #41, 49, and 57 may be combined with one or more of the features recited in embodiments #42-48, #50-56, and #58-60. Moreover, that any one or more of the features in embodiments #1-60 can be combined is contemplated by this disclosure.

Embodiment #1. A conformable wearable battery pack for detecting presence of a conducting liquid in an external connector, the conformable wearable battery pack comprising:

a sealed housing;

a flexible circuit board in the sealed housing;

one or more batteries connected to the flexible circuit board;

the external connector comprising a plurality of terminals, wherein the external connector is configured to be connectable to one or more external devices, and wherein the plurality of terminals comprise a power terminal, a ground terminal, paired data terminals, and an unused terminal;

a controller, connected to the flexible circuit board, comprising a power pin connected to the power terminal, a ground pin connected to the ground terminal, paired data pins connected to respective paired data terminals, and a voltage level input, wherein the controller is configured to provide power from the one or more batteries to the external connector; and one of a pull-up resistor or pull-down resistor connected to the unused terminal to pull a voltage of the unused terminal to one of a high voltage or ground, wherein the controller is further configured to:

determine whether the voltage of the unused terminal, received at the voltage level input, satisfies a voltage threshold corresponding to conduction, in the conducting liquid, between the unused terminal and one of the ground terminal or the power terminal, and disable, based on a determination that the voltage of the unused terminal satisfies the voltage threshold, power from being supplied to the power terminal.

Embodiment #2. The conformable wearable battery pack of Embodiment #1, wherein the unused terminal is not connected to the controller.

Embodiment #3. The conformable wearable battery pack of Embodiment #1, wherein the unused terminal is connected to a pin of the controller, and wherein the controller is configured to permit the pin connected to the unused terminal to float.

Embodiment #4. The conformable wearable battery pack of Embodiment #1, wherein the controller is further configured to determine, via the voltage level input, the voltage of the unused terminal, and wherein the disabling the power from being supplied to the power terminal reduces electrolytic or galvanic corrosion between the plurality of terminals.

Embodiment #5. The conformable wearable battery pack of Embodiment #1, further comprising:

an analog-to-digital (A/D) converter configured to convert an analog voltage of the unused terminal into a digital value, wherein the determination, by the controller, that the voltage of the unused terminal satisfies the voltage threshold comprises comparing the digital value to the voltage threshold.

Embodiment #6. The conformable wearable battery pack of Embodiment #1, wherein the external connector is a USB Type-A version 3.0+ connector, and wherein the controller is configured to detect conductance between the ground terminal and the unused terminal of the USB Type-A version 3.0+ connector.

Embodiment #7. The conformable wearable battery pack of Embodiment #1, wherein the one of the pull-up resistor or pull-down resistor is a pull-up resistor configured to pull the voltage of the unused terminal to the high voltage.

Embodiment #8. The conformable wearable battery pack of Embodiment #1, further comprising:

a switch connected between the power pin and the power terminal, wherein the controller is further configured to open the switch to prevent a positive voltage level from being provided to the power terminal.

Embodiment #9. The conformable wearable battery pack of Embodiment #1, wherein the controller is further configured to, based on the determination that the voltage of the unused terminal satisfies the voltage threshold, generate an alert, wherein the alert identifies the external connector exhibiting conduction in a conducting liquid.

Embodiment #10. The conformable wearable battery pack of Embodiment #1, wherein the controller is further configured to:

determine whether a time threshold has elapsed since the controller disabled power from being supplied to the external connector; and reenable, based on the time threshold having elapsed, power being supplied to the external connector.

Embodiment #11. A conformable wearable battery pack for detecting conduction between two or more external connectors in a conducting liquid, the conformable wearable battery pack comprising:

a sealed housing;

a flexible circuit board in the sealed housing;

one or more batteries connected to the flexible circuit board;

a first external connector of the two or more external connectors comprising a power terminal, a ground terminal, and paired data terminals, wherein the first external connector is configured to provide power externally from the one or more batteries;

a second external connector of the two or more external connectors comprising terminals, wherein the second external connector is configured to provide power externally from the one or more batteries;

a controller, connected to the flexible circuit board, comprising a power pin connected to the power terminal, paired data pins connected to respective paired data terminals, and a ground pin connected to the ground terminal; and one of a pull-up resistor or pull-down resistor connected to a terminal of the terminals of the second external connector, wherein the controller is further configured to:

determine whether a voltage of the terminal of the second external connector satisfies a voltage threshold corresponding to conduction, in the conducting liquid, between the terminal of the second external connector and one of the power terminal or the ground terminal, and disable, based on a determination that the voltage of the terminal of the second external connector satisfies the voltage threshold, power from being supplied to the power terminal.

Embodiment #12. The conformable wearable battery pack of Embodiment #11, wherein the first external connector is a first type of external connectors, wherein the second external connector is a second type of external connectors, wherein the first type differs from the second type.

Embodiment #13. The conformable wearable battery pack of Embodiment #11, wherein each of the first external connector and the second external connector are USB Type-A connectors.

Embodiment #14. The conformable wearable battery pack of Embodiment #11, wherein the controller is further configured to, based on the determination that the voltage of the terminal of the second external connector satisfies the voltage threshold, generate an alert, wherein the alert identifies the second external connector exhibiting conduction in a conducting liquid.

Embodiment #15. A conformable wearable battery pack for detecting presence of a conducting liquid in an external connector, the conformable wearable battery pack comprising:

a sealed housing;

a flexible circuit board in the sealed housing;

one or more batteries connected to the flexible circuit board;

an external connector comprising a plurality of terminals, wherein the external connector is configured to provide power externally from the one or more batteries;

a controller, connected to the flexible circuit board, comprising a plurality of pins connected to respective terminals of the external connector, wherein the controller is configured to provide a ground voltage level to at least a first terminal of the plurality of terminals and to provide a high voltage level to at least a second terminal of the plurality of terminals; and one of a pull-up resistor or a pull-down resistor connected an unused terminal of the plurality of terminals to pull a voltage of the unused terminal to one of the high voltage level or the ground voltage level; and a detector configured to determine whether a voltage of the unused terminal satisfies a voltage threshold corresponding to conduction, in the conducting liquid, between the unused terminal and one of the first terminal or the second terminal, wherein the controller is further configured to, based on a determination that the voltage of the unused terminal satisfies the voltage threshold, disable power from being supplied by the external connector.

Embodiment #16. The conformable wearable battery pack of Embodiment #15, wherein the detector comprises a comparator including a non-inverting input receiving the voltage threshold, an inverting input receiving the voltage of the unused terminal, and an output, and wherein the controller is further configured to, based on the output of the detector, disable interactions with the external connector Embodiment #17. The conformable wearable battery pack of Embodiment #16, wherein the detector further comprises:

two or more additional comparators wherein each comparator is configured to receive the voltage of the unused terminal on a respective inverting input and receive a different voltage threshold on a respective non-inverting input.

Embodiment #18. The conformable wearable battery pack of Embodiment #17, further comprising:

a switch configured to enable one of the comparators.

Embodiment #19. The conformable wearable battery pack of Embodiment #18, wherein the different voltage thresholds correspond to voltages of the unused terminal when exposed to a different conducting liquid.

Embodiment #20. The conformable wearable battery pack of Embodiment #15, wherein the detector comprises a comparator with hysteresis including a non-inverting input receiving the voltage threshold, an inverting input receiving the voltage of the unused terminal, an output, and a resistor connected between the output and the non-inverting input, and wherein the controller is further configured to, based on the output of the detector, disable interactions with the external connectors.

Embodiment #21. A conformable wearable battery pack for detecting presence of a conducting liquid in an external connector, the conformable wearable battery pack comprising:

a sealed housing;

a flexible circuit board in the sealed housing;

one or more batteries connected to the flexible circuit board;

a uniform serial bus (USB) connector configured to provide power from the one or more batteries external to the sealed housing, the USB connector comprising a plurality of terminals including at least a power terminal, a ground terminal, and at least one additional terminal;

a controller, connected to the flexible circuit board, comprising a plurality of pins including a positive voltage level pin connected to the power terminal and a ground voltage level pin connected to the ground terminal;

one of a pull-up resistor or a pull-down resistor connected to the at least one additional terminal to pull a voltage of the at least one additional terminal to one of a high voltage level or the ground voltage level;

a detector configured to determine whether the voltage of the at least one additional terminal satisfies a voltage threshold corresponding to conduction, in the conducting liquid, between the at least one additional terminal and one of the power terminal or the ground terminal; and a power reduction circuit configured to, based on the detector detecting the voltage satisfies the voltage threshold, reduce power supplied by the positive voltage level pin.

Embodiment #22. The conformable wearable battery pack of Embodiment #21, wherein the at least one additional terminal of the USB connector is not connected to the controller.

Embodiment #23. The conformable wearable battery pack of Embodiment #21, wherein the at least one additional terminal of the USB connector is connected to a pin of the controller, and wherein the controller is configured to permit the pin connected to the at least one additional terminal to float.

Embodiment #24. The conformable wearable battery pack of Embodiment #21, wherein the power reduction circuit is configured to prevent a positive voltage level from being provided by the controller to the power terminal, and wherein preventing the positive voltage level from being provided reduces electrolytic or galvanic corrosion between the plurality of terminals of the USB connector.

Embodiment #25. The conformable wearable battery pack of Embodiment #21, wherein the detector is configured to determine conduction between the at least one additional terminal and the ground terminal.

Embodiment #26. The conformable wearable battery pack of Embodiment #25, wherein the USB connector is a uniform serial bus (USB) Type-A connector version 3.0 or later connector, wherein the USB connector comprises paired data terminals, wherein the controller further comprises paired data pins connected to the paired data terminals, and wherein the controller is configured to exchange data over the paired data pins in accordance with one of USB standards version 1.0 or USB standards version 2.0.

Embodiment #27. The conformable wearable battery pack of Embodiment #26, wherein the power terminal corresponds to terminal 1 of a USB Type-A connector version 3.0 or later connector, wherein the data terminals correspond to terminals 2 and 3 of the USB Type-A connector version 3.0 or later connector, wherein the ground terminal corresponds to terminal 4 of the USB Type-A connector version 3.0 or later connector, and wherein the at least one additional terminal is selected from the group of terminals 5-9 of the USB Type-A connector version 3.0 or later connector.

Embodiment #28. The conformable wearable battery pack of Embodiment #21, wherein the detector comprises a comparator including a non-inverting input receiving the voltage threshold, an inverting input receiving the voltage of the at least one additional terminal, and an output, and wherein the power reduction circuit reduces the power by reducing a voltage level of the positive voltage level pin based on the output of the comparator.

Embodiment #29. The conformable wearable battery pack of Embodiment #28, wherein the detector further comprises:

two or more additional comparators wherein each comparator is configured to receive the voltage of the at least one additional terminal on a respective inverting input and receive a different voltage threshold on a respective non-inverting input.

Embodiment #30. The conformable wearable battery pack of Embodiment #29, further comprising:

a switch configured to enable one of the additional comparators.

Embodiment #31. The conformable wearable battery pack of Embodiment #29, wherein the different voltage thresholds correspond to voltages of the at least one additional terminal when exposed to a different conducting liquid.

Embodiment #32. The conformable wearable battery pack of Embodiment #21, wherein the detector comprises a comparator including a non-inverting input receiving the voltage threshold, an inverting input receiving the voltage of the at least one additional terminal, and an output, and wherein the power reduction circuit modifies how often the positive voltage level pin provides power to the power terminal.

Embodiment #33. The conformable wearable battery pack of Embodiment #21, wherein the detector further comprises:

two or more additional comparators with hysteresis wherein each comparator with hysteresis is configured to receive the voltage of the at least one additional terminal on a respective inverting input and receive a different voltage threshold on a respective non-inverting input.

Embodiment #34. The conformable wearable battery pack of Embodiment #13, wherein the different voltage thresholds correspond to voltages of the at least one additional terminal when exposed to a different conducting liquid.

Embodiment #35. The conformable wearable battery pack of Embodiment #21, further comprising:

a delay circuit connected between an output of the detector and an input of the power reduction circuit, wherein the delay circuit comprises two or more inverters.

Embodiment #36. The conformable wearable battery pack of Embodiment #21, further comprising:

a delay circuit connected between an output of the detector and an input of the power reduction circuit, wherein the delay circuit comprises a resistor and a capacitor.

Embodiment #37. The conformable wearable battery pack of Embodiment #21, further comprising:

a delay circuit connected between an output of the detector and an input of the power reduction circuit, wherein the delay circuit is configured to delay the output of the detector until a voltage level of the output has remained at the voltage level for at least a delay period.

Embodiment #38. A conformable wearable battery pack for detecting presence of a conducting liquid in an external connector, the conformable wearable battery pack comprising:

a sealed housing;

a flexible circuit board in the sealed housing;

one or more batteries connected to the flexible circuit board;

a uniform serial bus (USB) connector configured to provide power from the one or more batteries external to the sealed housing, the USB connector comprising a plurality of terminals including at least a power terminal, a ground terminal, and at least one additional terminal;

a controller, connected to the flexible circuit board, comprising a plurality of pins including a positive voltage level pin connected to the power terminal and a ground voltage level pin connected to the ground terminal;

one of a pull-up resistor or a pull-down resistor connected to the at least one additional terminal to pull a voltage of the at least one additional terminal to one of a high voltage level or the ground voltage level;

a detector configured to determine whether the voltage of the at least one additional terminal satisfies, for at least a time threshold, a voltage threshold corresponding to conduction, in the conducting liquid between the at least one additional terminal and one of the power terminal or the ground terminal; and a power reduction circuit configured to, based on the detector detecting the voltage satisfies the voltage threshold for at least the time threshold, disable power from being supplied to the positive voltage level pin.

Embodiment #39. The conformable wearable battery pack of Embodiment #38, wherein the detector comprises a comparator with a delay circuit.

Embodiment #40. A conformable wearable battery pack for determining a type of conducting liquid in an external connector, the conformable wearable battery pack comprising:

a sealed housing;

a flexible circuit board in the sealed housing;

one or more batteries in the sealed housing;

a uniform serial bus (USB) connector configured to provide power from the one or more batteries external to the sealed housing, the USB connector comprising a plurality of terminals including at least a power terminal, a ground terminal, and at least one additional terminal;

a controller, connected to the flexible circuit board, comprising a plurality of pins including a positive voltage level pin connected to the power terminal and a ground voltage level pin connected to the ground terminal;

one of a pull-up resistor or a pull-down resistor connected to the at least one additional terminal to pull a voltage of the at least one additional terminal to one of a high voltage level or the ground voltage level; and a plurality of voltage detectors configured to determine, based on conduction between the at least one additional terminal and one of the power terminal or the ground terminal, whether a voltage threshold for a respective voltage detector has been satisfied, wherein the controller is configured to generate an alert based on which voltage detectors have detected that their respective voltage thresholds have been satisfied.

Embodiment #41. A computer-implemented method for detecting presence of a conducting liquid in an external connector of a conformable wearable battery pack, the computer-implemented method comprising:

receiving, from a memory and by a controller of the conformable wearable battery, a voltage threshold value and a time threshold value;

controlling, via the controller and to a uniform serial bus (USB) connector comprising a plurality of terminals, a first direct current (DC) voltage level to be supplied to a first terminal of the plurality of terminals of the USB connector;

receiving, by the controller, a signal corresponding to a voltage level of an unused terminal of the terminals of the USB connector;

determining, by the controller, whether the voltage level of the unused terminal satisfies the voltage threshold value;

determining, by the controller, an elapsed time since a determination that the voltage level of the unused terminal satisfies the voltage threshold value; and modifying, based on the determination that the voltage level of the unused terminal satisfies the voltage threshold value and the elapsed time satisfies the time threshold value, the DC voltage level supplied to the first terminal while continuing to permit operation of the controller.

Embodiment #42. The computer-implemented method of Embodiment #41, wherein the signal comprises an analog signal, wherein the computer-implemented method further comprising converting, via the controller, the analog signal into a digital value, and wherein the determining that the voltage level of the unused terminal satisfies the voltage threshold value comprises comparing, via the controller, the voltage threshold value and the digital value.

Embodiment #43. The computer-implemented method of Embodiment #41, wherein the signal corresponding to the voltage level of the unused terminal is a digital value having been converted, via an analog-to-digital (A/D) converter, from an analog voltage level of the unused terminal into a digital representation of the analog voltage level.

Embodiment #44. The computer-implemented method of Embodiment #41, wherein the receiving the voltage threshold value and the time threshold value comprises receiving a plurality of voltage threshold values, wherein the determining whether the voltage level of the unused terminal satisfies the voltage threshold value comprises determining whether the voltage level of the unused terminal satisfies one or more of the plurality of voltage threshold values, and wherein the modifying the DC voltage level is based on a determination that one or more of the plurality of voltage threshold values has been satisfied.

Embodiment #45. The computer-implemented method of Embodiment #44, wherein the receiving the voltage threshold value and the time threshold value further comprises receiving a plurality of time threshold values associated with one or more of the plurality of voltage threshold values, wherein the determining whether the voltage level of the unused terminal satisfies one or more of the voltage threshold values comprises determining whether the voltage level of the unused terminal satisfies one or more of the plurality of voltage threshold values and an associated time threshold value, and wherein the modifying the DC voltage level is based on a determination that one or more of the plurality of voltage threshold values and associated time threshold value has been satisfied.

Embodiment #46. The computer-implemented method of Embodiment #45, wherein the time threshold values are associated with one of an initial voltage threshold value or a settled voltage threshold value.

Embodiment #47. The computer-implemented method of Embodiment #45, wherein each time threshold values is associated with a specific voltage threshold value of the voltage threshold values.

Embodiment #48. The computer-implemented method of Embodiment #41, wherein the modifying is based on the controller determining that a conductive fluid is causing conduction between the unused terminal and a second terminal of the USB terminals, wherein the second terminal is connected to a ground voltage level, and wherein the modifying reduces galvanic corrosion between the plurality of terminals.

Embodiment #49. A conformable wearable battery pack comprising:

a sealed housing;

a flexible circuit board in the sealed housing;

one or more batteries connected to the flexible circuit board;

a USB connector comprising a plurality of terminals including at least a first terminal and a second terminal, one or more controllers connected to the flexible circuit board; and a memory configured to store a voltage threshold value, a time threshold value, and instructions, wherein the instructions, when executed by the one or more controllers, cause the conformable wearable battery pack to:

receive the voltage threshold value and the time threshold value;

control a first direct current (DC) voltage level to be supplied to the first terminal;

receive a signal corresponding to a voltage level of the second terminal;

determine whether the voltage level of the second terminal satisfies the voltage threshold value;

determine an elapsed time since a determination that the voltage level of the second terminal satisfies the voltage threshold value; and modify, based on the determination that the voltage level of the second terminal satisfies the voltage threshold value and the elapsed time satisfies the time threshold value, the DC voltage level supplied to the first terminal.

Embodiment #50. The conformable wearable battery pack of Embodiment #49, wherein the signal comprises an analog signal, wherein the instructions further cause the conformable wearable battery pack to convert, via the one or more controllers, the analog signal into a digital value, and wherein the instructions to determine whether the voltage level of the second terminal satisfies the voltage threshold value further cause the one or more controllers to compare the voltage threshold value and the digital value.

Embodiment #51. The conformable wearable battery pack of Embodiment #49, further comprising:

an analog-to-digital (A/D) converter configured to convert an analog voltage level of the second terminal into a digital representation of the analog voltage level.

Embodiment #52. The conformable wearable battery pack of Embodiment #49, wherein the instructions to receive the voltage threshold value and the time threshold value further cause the one or more controllers to receive a plurality of voltage threshold values, wherein the instructions to determine whether the voltage level of the second terminal satisfies the voltage threshold value further cause the one or more controllers to determine whether the voltage level of the second terminal satisfies one or more of the plurality of voltage threshold values, and wherein the instructions to modify the DC voltage level are based on a determination that one or more of the plurality of voltage threshold values has been satisfied.

Embodiment #53. The conformable wearable battery pack of Embodiment #52, wherein the instructions to receive the voltage threshold value and the time threshold value further cause the one or more controllers to receive a plurality of time threshold values associated with one or more of the plurality of voltage threshold values, wherein the instructions to determine whether the voltage level of the second terminal satisfies one or more of the voltage threshold values further cause the one or more controllers to determine whether the voltage level of the second terminal satisfies one or more of the plurality of voltage threshold values and an associated time threshold value, and wherein the instructions to modify the DC voltage level are based on a determination that one or more of the plurality of voltage threshold values and associated time threshold value has been satisfied.

Embodiment #54. The conformable wearable battery pack of Embodiment #53, wherein the time threshold values are associated with one of an initial voltage threshold value or a settled voltage threshold value.

Embodiment #55. The conformable wearable battery pack of Embodiment #53, wherein each time threshold values is associated with a specific voltage threshold value of the voltage threshold values.

Embodiment #56. The conformable wearable battery pack of Embodiment #49, wherein the instructions to modify are based on the one or more controllers determining that a conductive fluid is causing conduction between the second terminal and a third terminal, and wherein the third terminal is connected to a ground voltage level.

Embodiment #57. One or more non-transitory media storing instructions that, when executed by one or more controllers, cause the one or more controllers to perform steps comprising:

receiving, from a memory and by a controller of a conformable wearable battery pack, a voltage threshold value and a time threshold value;

controlling, via the controller and to a USB connector, external to the conformable wearable battery pack, comprising a plurality of terminals, a first direct current (DC) voltage level to be supplied to a first terminal of the terminals of the USB connector;

receiving, by the controller, a signal corresponding to a voltage level of a second terminal of the terminals of the USB connector;

determining, by the controller, whether the voltage level of the second terminal satisfies the voltage threshold value;

determining, by the controller, an elapsed time since a determination that the voltage level of the second terminal satisfies the voltage threshold value; and modifying, based on the determination that the voltage level of the second terminal satisfies the voltage threshold value and the elapsed time satisfies the time threshold value, the DC voltage level supplied to the first terminal.

Embodiment #58. The one or more non-transitory media of Embodiment #57, wherein the signal comprises an analog signal, wherein the instructions further cause the one or more controllers to perform steps comprising converting, via the controller, the analog signal into a digital value, and wherein the determining that the voltage level of the second terminal satisfies the voltage threshold value comprises comparing, via the controller, the voltage threshold value and the digital value.

Embodiment #59. The one or more non-transitory media of Embodiment #57, wherein the signal corresponding to the voltage level of the second terminal is a digital value having been converted, via an analog-to-digital (A/D) converter, from an analog voltage level of the second terminal into a digital representation of the analog voltage level.

Embodiment #60. The one or more non-transitory media of Embodiment #57, wherein the instructions for receiving the voltage threshold value and the time threshold value cause the one or more controllers to further perform receiving a plurality of voltage threshold values, wherein the instructions for determining whether the voltage level of the second terminal satisfies the voltage threshold value cause the one or more controllers to perform further steps comprising determining whether the voltage level of the second terminal satisfies one or more of the plurality of voltage threshold values, and wherein the instructions for modifying the DC voltage level are based on a determination that one or more of the plurality of voltage threshold values has been satisfied.

In additional aspects, a battery system may comprise one or more battery packs. Each battery pack includes a battery management system in which one of the battery packs is flexibly configured as a master (e.g., primary) battery pack while the other battery packs are configured as slave (e.g., secondary) battery packs.

As can be appreciated by one skilled in the art, a computer system with an associated computer-readable medium containing instructions for controlling the computer system can be utilized to implement the exemplary embodiments that are disclosed herein. The computer system may include at least one computer such as a microprocessor, digital signal processor, and associated peripheral electronic circuitry.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A computer-implemented method for detecting presence of a conducting liquid in an external connector of a conformable wearable battery pack, the computer-implemented method comprising:
   receiving, from a memory and by a controller of the conformable wearable battery, a voltage threshold value and a time threshold value;
   controlling, via the controller and to a uniform serial bus (USB) connector comprising a plurality of terminals, a first direct current (DC) voltage level to be supplied to a first terminal of the plurality of terminals of the USB connector;
   receiving, by the controller, a signal corresponding to a voltage level of an unused terminal of the terminals of the USB connector;
   determining, by the controller, whether the voltage level of the unused terminal satisfies the voltage threshold value;
   determining, by the controller, an elapsed time since a determination that the voltage level of the unused terminal satisfies the voltage threshold value; and
   modifying, based on the determination that the voltage level of the unused terminal satisfies the voltage threshold value and the elapsed time satisfies the time threshold value, the DC voltage level supplied to the first terminal while continuing to permit operation of the controller.

2. The computer-implemented method of claim 1, wherein the signal comprises an analog signal,
   wherein the computer-implemented method further comprising converting, via the controller, the analog signal into a digital value, and
   wherein the determining that the voltage level of the unused terminal satisfies the voltage threshold value comprises comparing, via the controller, the voltage threshold value and the digital value.

3. The computer-implemented method of claim 1, wherein the signal corresponding to the voltage level of the unused terminal is a digital value having been converted, via an analog-to-digital (A/D) converter, from an analog voltage level of the unused terminal into a digital representation of the analog voltage level.

4. The computer-implemented method of claim 1,
   wherein the receiving the voltage threshold value and the time threshold value comprises receiving a plurality of voltage threshold values,
   wherein the determining whether the voltage level of the unused terminal satisfies the voltage threshold value comprises determining whether the voltage level of the unused terminal satisfies one or more of the plurality of voltage threshold values, and
   wherein the modifying the DC voltage level is based on a determination that one or more of the plurality of voltage threshold values has been satisfied.

5. The computer-implemented method of claim 4,
   wherein the receiving the voltage threshold value and the time threshold value further comprises receiving a plurality of time threshold values associated with one or more of the plurality of voltage threshold values, wherein the determining whether the voltage level of the unused terminal satisfies one or more of the voltage threshold values comprises determining whether the voltage level of the unused terminal satisfies one or more of the plurality of voltage threshold values and an associated time threshold value, and
   wherein the modifying the DC voltage level is based on a determination that one or more of the plurality of voltage threshold values and associated time threshold value has been satisfied.

6. The computer-implemented method of claim 5, wherein the time threshold values are associated with one of an initial voltage threshold value or a settled voltage threshold value.

7. The computer-implemented method of claim 5, wherein each time threshold values is associated with a specific voltage threshold value of the voltage threshold values.

8. The computer-implemented method of claim 1,
   wherein the modifying is based on the controller determining that a conductive fluid is causing conduction between the unused terminal and a second terminal of the USB terminals,
   wherein the second terminal is connected to a ground voltage level, and
   wherein the modifying reduces galvanic corrosion between the plurality of terminals.

9. A conformable wearable battery pack comprising:
   a sealed housing;
   a flexible circuit board in the sealed housing;
   one or more batteries connected to the flexible circuit board;
   a USB connector comprising a plurality of terminals including at least a first terminal and a second terminal,
   one or more controllers connected to the flexible circuit board; and
   a memory configured to store a voltage threshold value, a time threshold value, and instructions, wherein the instructions, when executed by the one or more controllers, cause the conformable wearable battery pack to:
   receive the voltage threshold value and the time threshold value;
   control a first direct current (DC) voltage level to be supplied to the first terminal;
   receive a signal corresponding to a voltage level of the second terminal;
   determine whether the voltage level of the second terminal satisfies the voltage threshold value;
   determine an elapsed time since a determination that the voltage level of the second terminal satisfies the voltage threshold value; and
   modify, based on the determination that the voltage level of the second terminal satisfies the voltage threshold value and the elapsed time satisfies the time threshold value, the DC voltage level supplied to the first terminal.

10. The conformable wearable battery pack of claim 9, wherein the signal comprises an analog signal,
    wherein the instructions further cause the conformable wearable battery pack to convert, via the one or more controllers, the analog signal into a digital value, and
    wherein the instructions to determine whether the voltage level of the second terminal satisfies the voltage threshold value further cause the one or more controllers to compare the voltage threshold value and the digital value.

11. The conformable wearable battery pack of claim 9, further comprising:

an analog-to-digital (A/D) converter configured to convert an analog voltage level of the second terminal into a digital representation of the analog voltage level.

12. The conformable wearable battery pack of claim 9, wherein the instructions to receive the voltage threshold value and the time threshold value further cause the one or more controllers to receive a plurality of voltage threshold values,
wherein the instructions to determine whether the voltage level of the second terminal satisfies the voltage threshold value further cause the one or more controllers to determine whether the voltage level of the second terminal satisfies one or more of the plurality of voltage threshold values, and
wherein the instructions to modify the DC voltage level are based on a determination that one or more of the plurality of voltage threshold values has been satisfied.

13. The conformable wearable battery pack of claim 12, wherein the instructions to receive the voltage threshold value and the time threshold value further cause the one or more controllers to receive a plurality of time threshold values associated with one or more of the plurality of voltage threshold values,
wherein the instructions to determine whether the voltage level of the second terminal satisfies one or more of the voltage threshold values further cause the one or more controllers to determine whether the voltage level of the second terminal satisfies one or more of the plurality of voltage threshold values and an associated time threshold value, and
wherein the instructions to modify the DC voltage level are based on a determination that one or more of the plurality of voltage threshold values and associated time threshold value has been satisfied.

14. The conformable wearable battery pack of claim 13, wherein the time threshold values are associated with one of an initial voltage threshold value or a settled voltage threshold value.

15. The conformable wearable battery pack of claim 13, wherein each time threshold values is associated with a specific voltage threshold value of the voltage threshold values.

16. The conformable wearable battery pack of claim 9, wherein the instructions to modify are based on the one or more controllers determining that a conductive fluid is causing conduction between the second terminal and a third terminal, and
wherein the third terminal is connected to a ground voltage level.

17. One or more non-transitory media storing instructions that, when executed by one or more controllers, cause the one or more controllers to perform steps comprising:

receiving, from a memory and by a controller of a conformable wearable battery pack, a voltage threshold value and a time threshold value;
controlling, via the controller and to a USB connector, external to the conformable wearable battery pack, comprising a plurality of terminals, a first direct current (DC) voltage level to be supplied to a first terminal of the terminals of the USB connector;
receiving, by the controller, a signal corresponding to a voltage level of a second terminal of the terminals of the USB connector;
determining, by the controller, whether the voltage level of the second terminal satisfies the voltage threshold value;
determining, by the controller, an elapsed time since a determination that the voltage level of the second terminal satisfies the voltage threshold value; and
modifying, based on the determination that the voltage level of the second terminal satisfies the voltage threshold value and the elapsed time satisfies the time threshold value, the DC voltage level supplied to the first terminal.

18. The one or more non-transitory media of claim 17, wherein the signal comprises an analog signal,
wherein the instructions further cause the one or more controllers to perform steps comprising converting, via the controller, the analog signal into a digital value, and
wherein the determining that the voltage level of the second terminal satisfies the voltage threshold value comprises comparing, via the controller, the voltage threshold value and the digital value.

19. The one or more non-transitory media of claim 17, wherein the signal corresponding to the voltage level of the second terminal is a digital value having been converted, via an analog-to-digital (A/D) converter, from an analog voltage level of the second terminal into a digital representation of the analog voltage level.

20. The one or more non-transitory media of claim 17, wherein the instructions for receiving the voltage threshold value and the time threshold value cause the one or more controllers to further perform receiving a plurality of voltage threshold values,
wherein the instructions for determining whether the voltage level of the second terminal satisfies the voltage threshold value cause the one or more controllers to perform further steps comprising determining whether the voltage level of the second terminal satisfies one or more of the plurality of voltage threshold values, and
wherein the instructions for modifying the DC voltage level are based on a determination that one or more of the plurality of voltage threshold values has been satisfied.

* * * * *